(12) United States Patent
Chan et al.

(10) Patent No.: US 11,037,853 B1
(45) Date of Patent: Jun. 15, 2021

(54) SEMICONDUCTOR PACKAGE STRUCTURE AND METHOD OF MANUFACTURING THE SAME

(71) Applicant: Advanced Semiconductor Engineering, Inc., Kaohsiung (TW)

(72) Inventors: Ya Fang Chan, Kaohsiung (TW); Yuan-Feng Chiang, Kaohsiung (TW); Po-Wei Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/717,933

(22) Filed: Dec. 17, 2019

(51) Int. Cl.
*H01L 23/04* (2006.01)
*H01L 23/367* (2006.01)
*H01L 23/433* (2006.01)
*H01L 25/065* (2006.01)
*H01L 21/768* (2006.01)
*H01L 25/00* (2006.01)
*H01L 21/48* (2006.01)

(52) U.S. Cl.
CPC ........ *H01L 23/367* (2013.01); *H01L 21/4882* (2013.01); *H01L 21/76879* (2013.01); *H01L 23/4334* (2013.01); *H01L 25/0657* (2013.01); *H01L 25/50* (2013.01)

(58) Field of Classification Search
CPC .......... H01L 23/3677; H01L 21/4882
See application file for complete search history.

(56) References Cited

U.S. PATENT DOCUMENTS

| | | | |
|---|---|---|---|
| 7,592,697 B2 | 9/2009 | Arana et al. | |
| 9,373,560 B2* | 6/2016 | Uchida | H02M 7/003 |
| 2011/0140260 A1* | 6/2011 | Bonthron | H01L 25/0652 |
| | | | 257/690 |
| 2016/0133613 A1* | 5/2016 | Seo | H01L 23/481 |
| | | | 257/686 |
| 2016/0309618 A1* | 10/2016 | Tsai | B23P 15/26 |
| 2018/0211899 A1* | 7/2018 | Morianz | H01L 23/5386 |

* cited by examiner

*Primary Examiner* — Thao P Le
(74) *Attorney, Agent, or Firm* — Foley & Lardner LLP

(57) ABSTRACT

A semiconductor heat dissipation structure includes a first semiconductor device including a first active surface and a first back surface opposite to the first active surface, a second semiconductor device including a second active surface and a second back surface opposite to the second active surface, a first heat conductive layer embedded in the first back surface of the first semiconductor device, a second heat conductive layer embedded in the second back surface of the second semiconductor device, and a third heat conductive layer disposed adjoining the first heat conductive layer and extending to the first active surface of the first semiconductor device. The first back surface of the first semiconductor device and the second back surface of the second semiconductor device are in contact with each other. At least a portion of the first heat conductive layer are in contact with the second heat conductive layer.

20 Claims, 41 Drawing Sheets

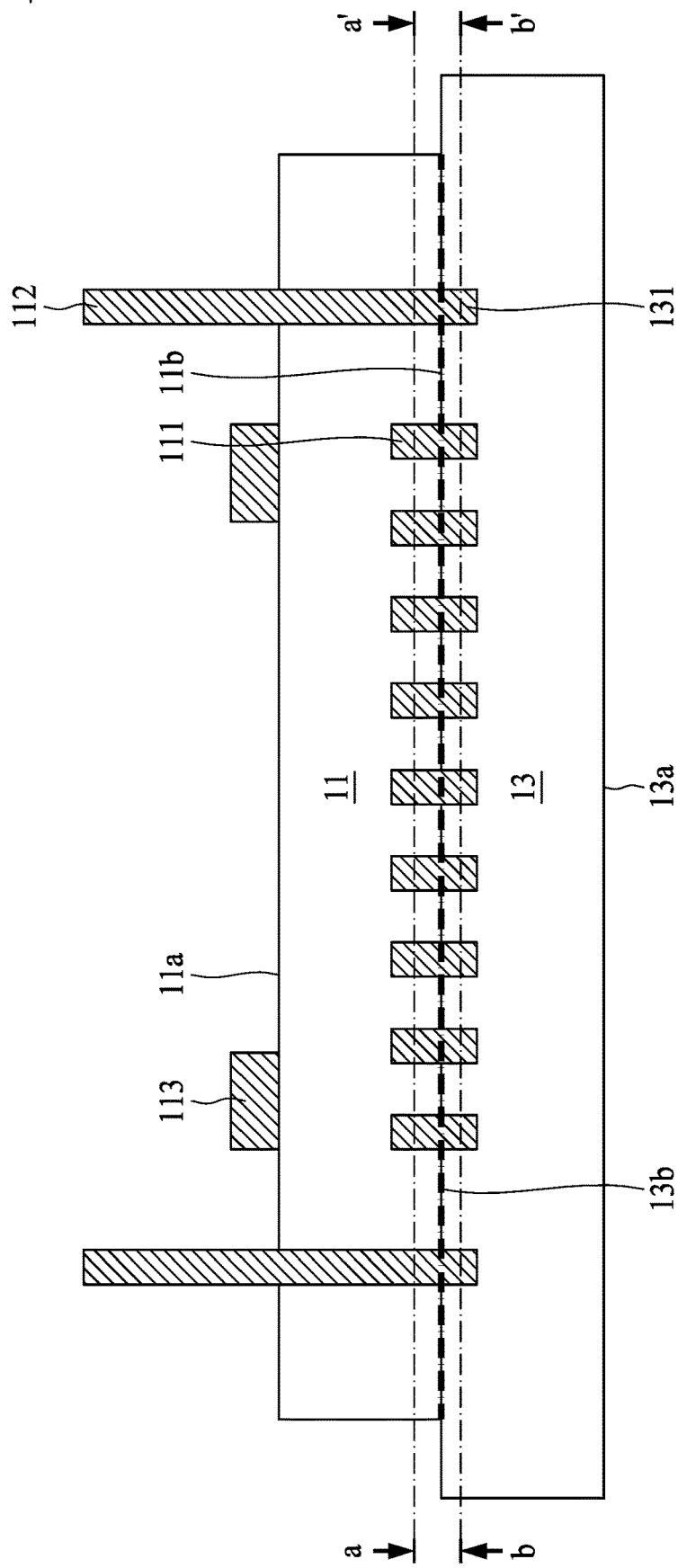

SEMICONDUCTOR PACKAGE STRUCTURE AND METHOD OF MANUFACTURING THE SAME

BACKGROUND

1. Technical Field

The present disclosure relates to a semiconductor package structure. In particular, the semiconductor package structure includes a semiconductor heat dissipation structure.

2. Description of the Related Art

Generally, a chip in a semiconductor package is encapsulated by a molding compound, and thermal energy generated from the chip may be transferred to the outside through the molding compound. The molding compound covers most of the back surface of the chip (up to 99%, or even more). Semiconductor packages have been marked by vast improvements in performance, but this has resulted in an enormous increase in thermal energy generated by the chip. The molding compound has a low coefficient of thermal expansion (CTE). Heat dissipation has thus become an issue, especially for stacked dies.

SUMMARY

In some embodiments, according to one aspect of the present disclosure, a semiconductor heat dissipation structure includes a first semiconductor device including a first active surface and a first back surface opposite to the first active surface, a second semiconductor device including a second active surface and a second back surface opposite to the second active surface, a first heat conductive layer embedded in the first back surface of the first semiconductor device, a second heat conductive layer embedded in the second back surface of the second semiconductor device, and a third heat conductive layer disposed adjoining the first heat conductive layer and extending to the first active surface of the first semiconductor device. The first back surface of the first semiconductor device and the second back surface of the second semiconductor device are in contact with each other. At least a portion of the first heat conductive layer are in contact with the second heat conductive layer.

In some embodiments, according to one aspect of the present disclosure, a semiconductor package structure includes a semiconductor heat dissipation structure, a first redistribution layer (RDL) disposed over the first active surface of the first semiconductor device and including a heat connection element penetrating through the first RDL, and a heat dissipation device disposed over the first RDL. The third heat conductive layer of the semiconductor heat dissipation structure is connected to the heat dissipation device via the heat connection element of the first RDL.

In some embodiments, according to another aspect of the present disclosure, a method is disclosed for manufacturing a semiconductor package structure. The method includes the following operations: providing a first semiconductor device including a first active surface and a first back surface opposite to the first active surface; providing a second semiconductor device including a second active surface and a second back surface opposite to the second active surface; forming a first heat conductive layer embedded in the first back surface of the first semiconductor device; forming a third heat conductive layer adjoining the first heat conductive layer and extending to the first active surface of the first semiconductor device; forming a second heat conductive layer embedded in the second back surface of the second semiconductor device; aligning the first heat conductive layer to the second heat conductive layer; bonding the first back surface of the first semiconductor device to the second back surface of the second semiconductor device to form a semiconductor heat dissipation structure; encapsulating the semiconductor heat dissipation structure; and connecting a heat dissipation device to the third heat conductive layer.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

FIG. 1A illustrates a cross-sectional view of a semiconductor heat dissipation structure according to some embodiments of the present disclosure.

Figure 1B:
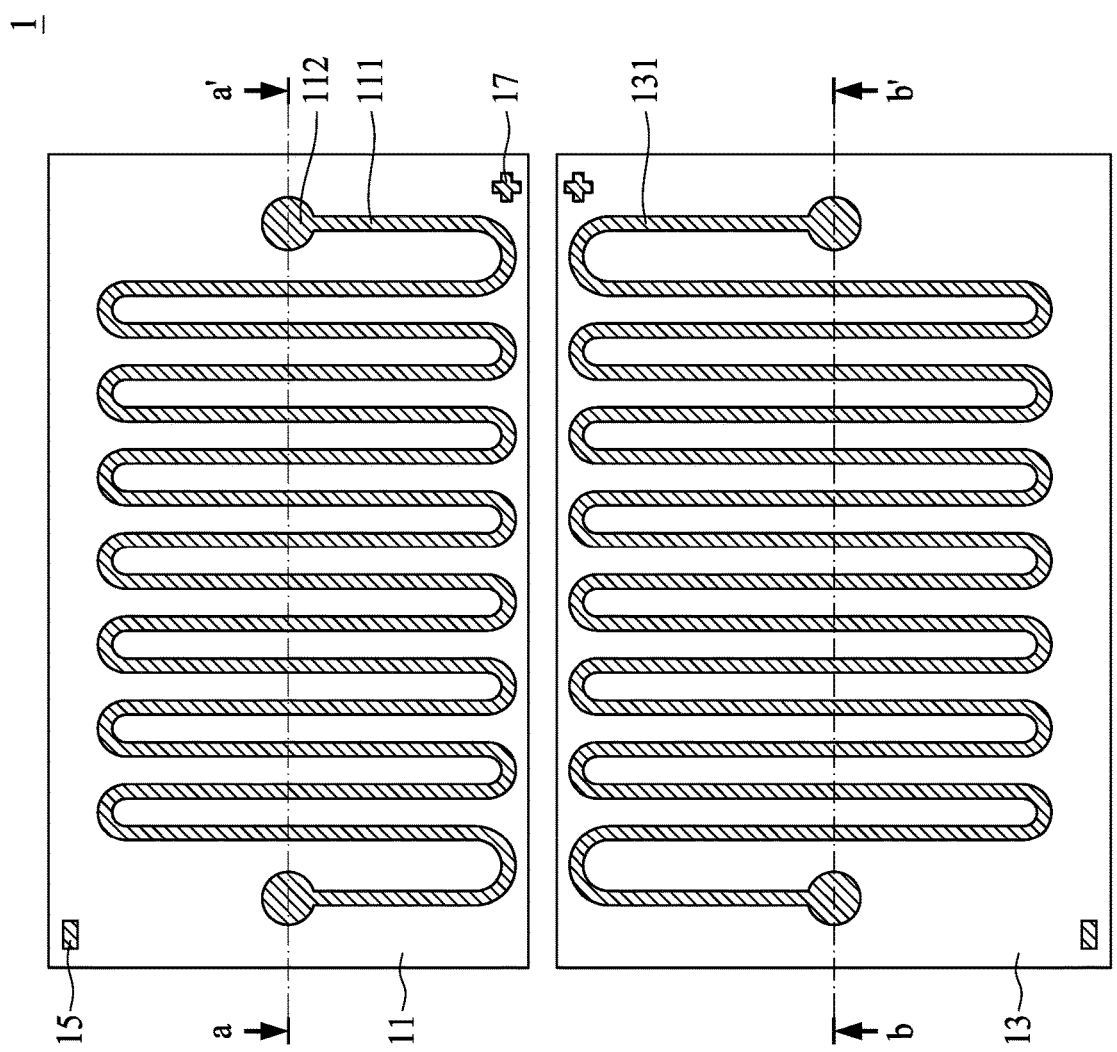
FIG. 1B illustrates a cross-sectional view of the semiconductor devices taken along lines a-a' and b-b' of FIG. 1A, respectively.

Common reference numerals are used throughout the drawings and the detailed description to indicate the same or similar components. The present disclosure will be more apparent from the following detailed description taken in conjunction with the accompanying drawings.

DETAILED DESCRIPTION

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

In some embodiments of the present disclosure, by disposing a heat conductive layer (e.g., copper, or other metal or alloy, other material which has a higher CTE than a CTE of the molding compound) on a back surface of each of the two stacked dies and disposing another heat conductive layer connecting to one of the heat conductive layers to the outside, the heat generated from the dies can be quickly transferred to the outside and thus the efficiency of heat dissipation can be significantly improved.

FIG. 1A is a cross-sectional view of a semiconductor heat dissipation structure 1 in accordance with some embodiments of the present disclosure. The semiconductor heat dissipation structure 1 includes a semiconductor device 11, a semiconductor device 13, a heat conductive layer 111, a heat conductive layer 131, and a heat conductive layer 112. Heat generated from the semiconductor device 11 or the semiconductor device 13 may be transferred outside through the heat conductive layers 111, 112, and 131.

The semiconductor device 11 includes an active surface 11a and a back surface 11b opposite to the active surface 11a. The semiconductor device 11 includes a conductive pillar 113 disposed on the active surface 11a. The semiconductor device 13 includes an active surface 13a and a back surface 13b opposite to the active surface 13a. The semiconductor device 11 is stacked on the semiconductor device 13. In some embodiments, a size (e.g., length or width) of the semiconductor device 11 is substantially equal to or smaller than a size of the semiconductor device 13. In some embodiments, a size (e.g., length or width) of the semiconductor device 11 is larger than a size of the semiconductor device 13. The back surface 11b of the semiconductor device 11 and the back surface 13b of the semiconductor device 13 are in contact with each other.

In some embodiments, the semiconductor device 11 may include an application-specific integrated circuit (ASIC), a controller, a processor, a memory, or other electronic component or semiconductor device. A type of the semiconductor device 13 may be the same as or different from that of the semiconductor device 11.

The back surface 11b of the semiconductor device 11 includes a groove and the heat conductive layer 111 is formed in the groove of the semiconductor device 11. The back surface 13b of the semiconductor device 13 includes a groove and the heat conductive layer 131 is formed in the groove of the semiconductor device 13. As shown in FIG. 1A, the groove of the semiconductor device 11 is filled by the heat conductive layer 111 or by the heat conductive layer 111 and the heat conductive layer 112. The groove of the semiconductor device 13 is filled by the heat conductive layer 131.

The heat conductive layer 111 is embedded in the back surface 11b of the semiconductor device 11. The heat conductive layer 131 is embedded in the back surface 13b of the semiconductor device 13. At least a portion of the heat conductive layer 111 is in contact with the heat conductive layer 131. For example, at least 10%, at least 20%, at least 30%, at least 40%, at least 50%, at least 60%, at least 70%, at least 80%, at least 90%, at least 95%, at least 95% or approximately 100% of the heat conductive layer 111 exposed from the back surface 11b of the semiconductor device 11 (based on the surface area of the heat conductive layer 111 exposed from the back surface 11b of the semiconductor device 11) is in contact with the heat conductive layer 131.

The heat conductive layer 112 is disposed adjoining the heat conductive layer 111 and extends to the active surface 11a of the semiconductor device 11. The heat conductive layer 112 is in direct contact with the heat conductive layer 111. The heat conductive layer 112 may be in contact with a distal end of the heat conductive layer 111 or other portion of the heat conductive layer 111. In some embodiments, the heat conductive layer 112 extends outside the active surface 11a of the semiconductor device 11. The heat conductive layer 112 may be disposed within the semiconductor device 11 as shown in FIG. 1A (e.g., penetrating the semiconductor device 11 and contacting the heat conductive layer 111) or disposed outside the semiconductor device 11 (e.g., attached to an exterior lateral surface of the semiconductor device 11). In some embodiments, the heat conductive layer 112 may be disposed on the heat conductive layer 131 or connected to (or electrically connected to) the heat conductive layer 131. The heat conductive layer 112 may be in contact with a distal end of the heat conductive layer 131 or other portion of the heat conductive layer 131.

In some embodiments, the heat conductive layer 112 may be a solid heat conductive post/pillar or a solid heat conductive plate. The heat conductive layer 111, the heat conductive layer 131, and the heat conductive layer 112 may be made of same or different metal, e.g., copper or other metal or alloy. The heat conductive layer 111 and the heat conductive layer 112 are formed in one piece.

In some embodiments, the heat conductive layer 112 is disposed at a periphery of the semiconductor device 11. The heat conductive layer 112 may be connected or electrically connected to a heat dissipation device (not shown in FIG. 1) outside the semiconductor heat dissipation structure 1. The heat dissipation device may be disposed over the active surface 11a of the semiconductor device 11.

In some embodiments, the heat conductive layer 112 may be disposed on the heat conductive layer 131 or in direct contact with the heat conductive layer 131.

FIG. 1B is a cross-sectional view of the semiconductor devices 11 and 13 taken along lines a-a' and b-b' of FIG. 1A, respectively. The heat conductive layer 111, the heat conductive layer 131 or both have a serpentine shape. In some embodiments, the heat conductive layer 111, the heat conductive layer 131 or both may have any suitable shape for dissipating heat generated from the semiconductor device 11 or the semiconductor device 13. The heat conductive layer 111 may comprises 10% or more, 20% or more, 30% or more, 40% or more, 50% or more, or 60% or more, or 70% or more surface area of the back surface 11b of the semiconductor device 11. In some embodiments, the heat conductive layer 111 may comprises 20% to 50% surface area of the back surface 11b of the semiconductor device 11. In some embodiments, the heat conductive layer 111 has a first shape and the heat conductive layer 131 has a second shape corresponding to the first shape of the heat conductive layer 111.

The semiconductor heat dissipation structure 1 further includes an alignment mark 15 and an alignment mark 17. A shape of the alignment mark 15 is different from a shape of the alignment mark 17. The heat conductive layers 111 may be aligned with the heat conductive layer 131 through the alignment marks 15 and 17 after the stacking of the semiconductor device 11 and the semiconductor device 13.

Figure 2:
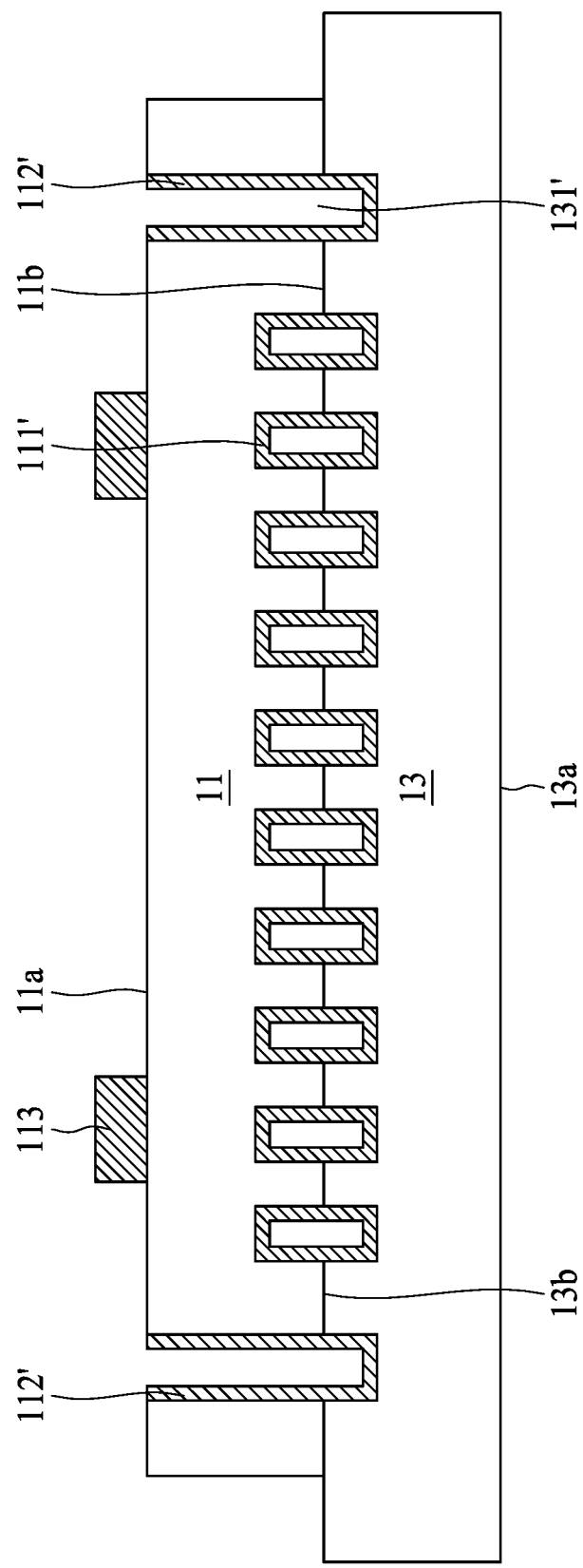
FIG. 2 illustrates a cross-sectional view of a semiconductor heat dissipation structure according to some embodiments of the present disclosure.

FIG. 2 is a cross-sectional view of a semiconductor heat dissipation structure 1' in accordance with some embodiments of the present disclosure. The semiconductor heat dissipation structure 1' is similar to the semiconductor heat dissipation structure 1 in FIG. 1A except that heat conductive layers 111', 112', and 131' are not a solid heat conductive layer but in a form of a hollow heat conductive pipe.

In some embodiments, the heat conductive layers 111' and 131' form a continuous, hollow heat conductive pipe. The hollow heat conductive pipe formed of the heat conductive layers 111' and 131' may be V-shaped or U-shaped heat conductive pipe or has any other suitable shape. The heat conductive layer 112' is a hollow heat conductive pipe connected to the hollow heat conductive pipe formed of the heat conductive layers 111' and 131'. The hollow heat conductive pipe formed of the heat conductive layer 112 may form a tubular passage for cooling liquid or cooling gas, together with the hollow heat conductive pipe formed of the heat conductive layers 111' and 131'.

Figure 3:
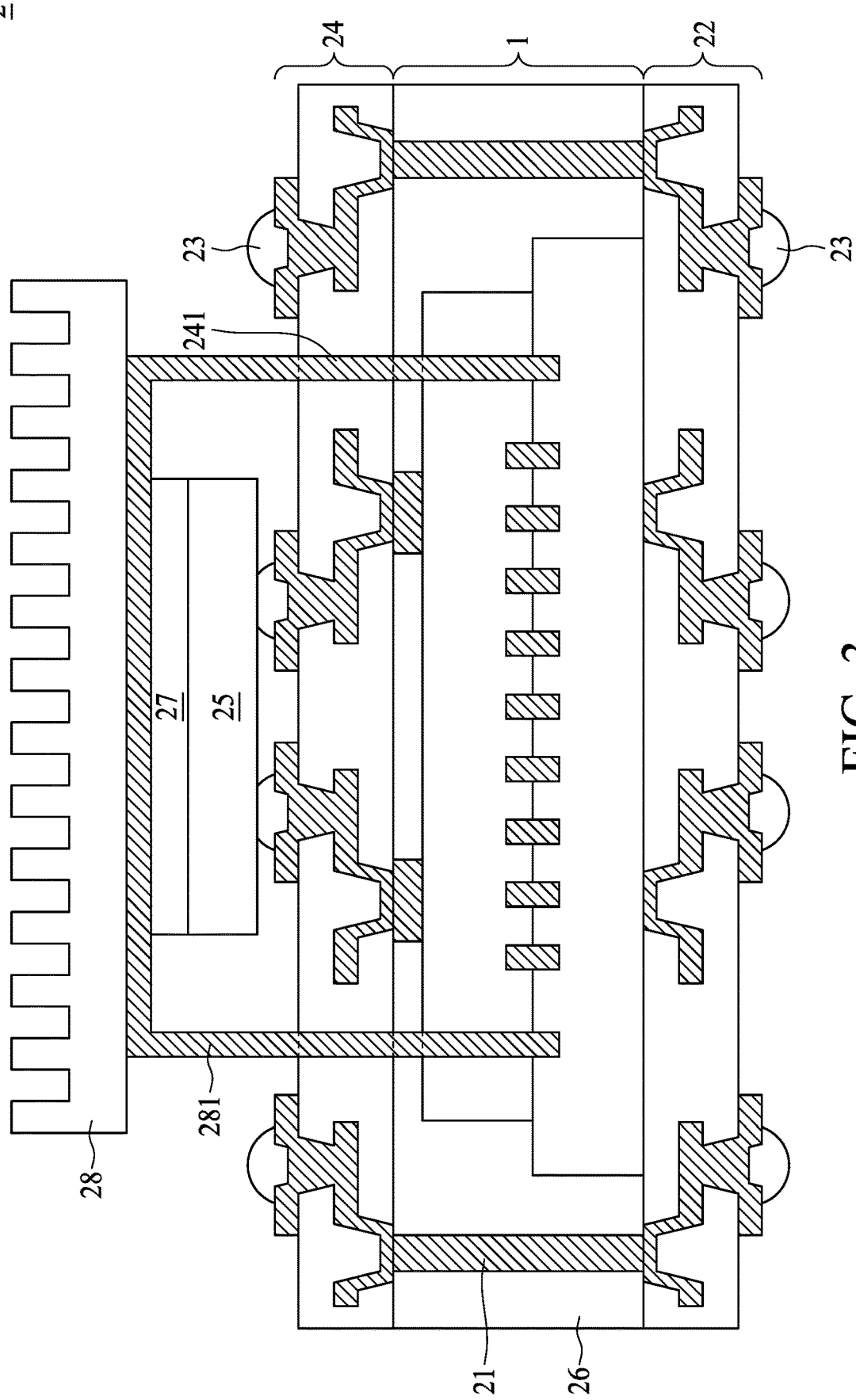
FIG. 3 illustrates a cross-sectional view of a semiconductor package structure according to some embodiments of the present disclosure.

FIG. 3 is a cross-sectional view of a semiconductor package structure 2 in accordance with some embodiments of the present disclosure. The semiconductor package structure 2 includes a semiconductor heat dissipation structure 1, a redistribution layer (RDL) 24, an encapsulant 26, and a heat dissipation device 28. In some embodiments, the semiconductor package structure 2 may further include a semiconductor device 25 disposed over the RDL 24 and electrically connected to the RDL 24.

The RDL 24 includes a heat connection element 241 penetrating through the RDL 24. The semiconductor package structure 2 further includes a heat connection element 281 disposed on the RDL 24 and connected to the heat connection element 241 and the heat dissipation device 28. Heat generated from the semiconductor devices 11 and 13 of the semiconductor heat dissipation structure 1 may be transferred to the outside of the semiconductor heat dissipation structure 1 through the heat conductive layers 111, 112, and 131, and further to the heat dissipation device 28 through the heat connection element 241 and the heat connection element 281.

The RDL 24 is disposed over or on the active surface 11a of the semiconductor device 11. The heat connection element 241 of the RDL 24 penetrates through the RDL 24. The conductive pillar 113 of the semiconductor device 11 electrically connects the semiconductor device 11 to the RDL 24. In some embodiments, the semiconductor package structure 2 may further include a RDL 22 disposed under the semiconductor heat dissipation structure 1. The RDL 22 may be disposed on the active surface 13a of the semiconductor device 13 and electrically connected to the semiconductor device 13. In some embodiments, the RDL 22 is electrically connected to the RDL 24 through an interconnection element 21. The interconnection element 21 is disposed within and penetrates the encapsulant 26. The encapsulant 26 encapsulates the semiconductor heat dissipation structure 1. In some embodiments, the semiconductor package structure 2 may further include electrical connection element 23. The electrical connection element 23 may be disposed on the RDL 22, or disposed on the RDL 24 to electrically connecting the RDL 22 or the RDL 24 to an external circuit or additional semiconductor device (e.g., the semiconductor device 25) or electronic device.

The heat dissipation device 28 is disposed over the RDL 24. The heat conductive layer 112 of the semiconductor heat dissipation structure 1 is connected to the heat dissipation device 28 via the heat connection element 241 of the RDL 24 and further in combination with the heat connection element 281.

The semiconductor device 25 is disposed over or on the RDL 24. In some embodiments, the semiconductor device 25 is disposed under the heat dissipation device 28. In some embodiments, a heat dissipation paste 27 may be disposed on the semiconductor device 25. The heat dissipation paste 27 may be disposed between the semiconductor device 25 and the heat dissipation device 28. The semiconductor device 25 may be connected to the heat dissipation device 28 via the heat connection element 281 and/or the heat dissipation paste 27 so that heat generated from the semiconductor device 25 can be transferred to the heat dissipation device 28.

Figure 4:
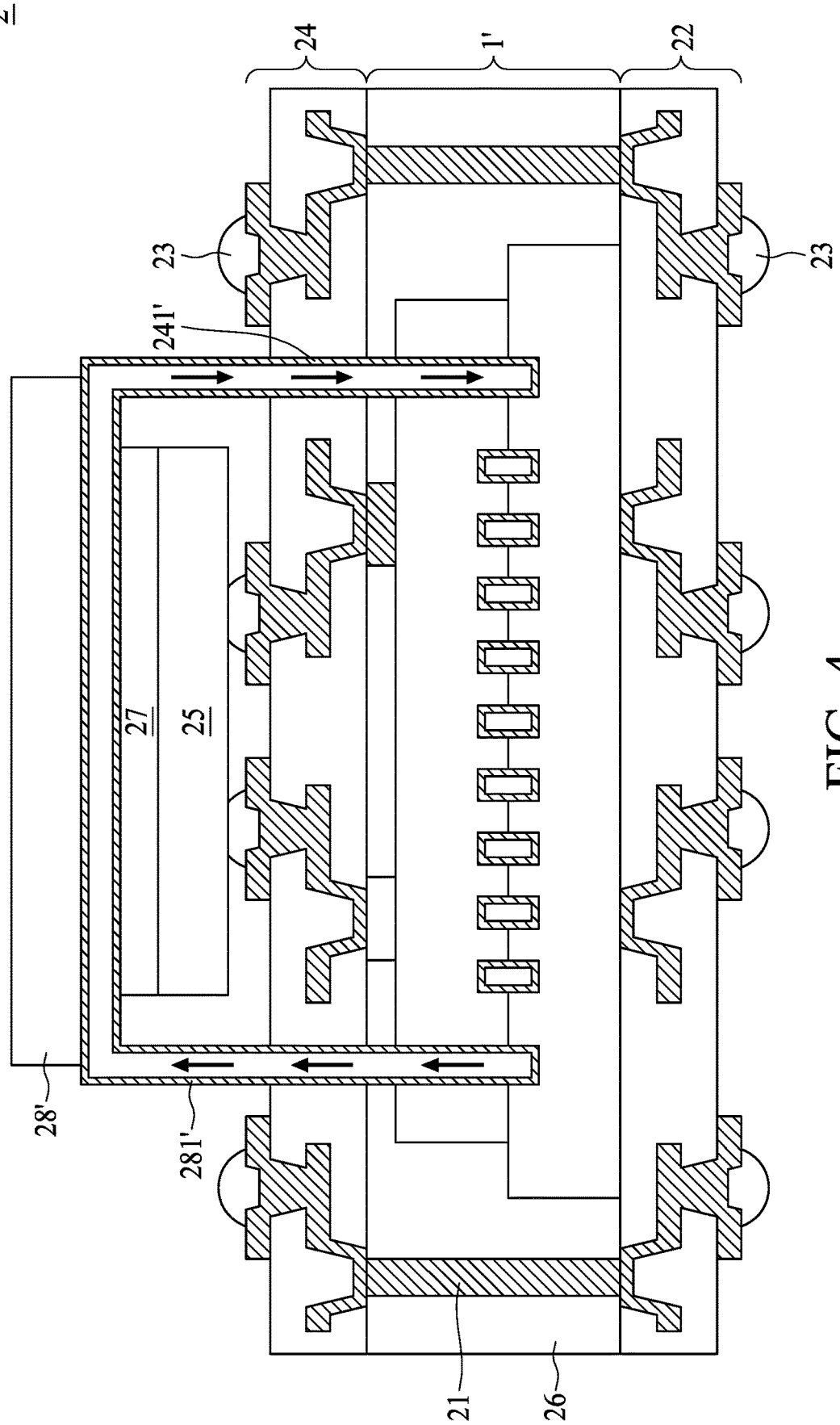
FIG. 4 illustrates a cross-sectional view of a semiconductor package structure according to some embodiments of the present disclosure.

FIG. 4 is a cross-sectional view of a semiconductor package structure 2' in accordance with some embodiments of the present disclosure. The semiconductor package structure 2' is similar to the semiconductor package structure 2 in FIG. 3 except that the semiconductor package structure 2' includes the semiconductor heat dissipation structure 1' of FIG. 2, a hollow heat connection element 241' and a hollow heat connection element 281'. In some embodiments, the hollow heat conductive pipe of the semiconductor heat dissipation structure 1', the hollow heat connection element 241' and the hollow heat connection element 281' form a closed, tubular passage for cooling liquid or cooling gas. By the circulation of the cooling liquid or cooling gas in the heat conductive pipes, heat generated from the semiconductor devices 11, 13 and 15 can be effectively transferred to the outside.

FIG. 5A through FIG. 5L illustrate some embodiments of a method of manufacturing a semiconductor heat dissipation structure 1 according to some embodiments of the present disclosure. Various figures have been simplified to more clearly present aspects of the present disclosure.

Figure 5A:
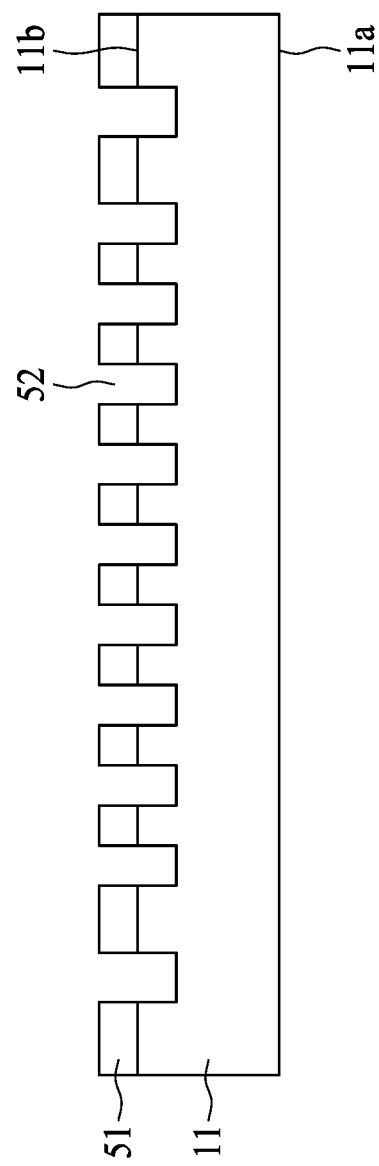
FIG. 5A, FIG. 5B, FIG. 5C, FIG. 5D, FIG. 5E, FIG. 5F, FIG. 5G, FIG. 5H, FIG. 5I, FIG. 5J, FIG. 5K, and FIG. 5L illustrate intermediate operations of a method for manufacturing a semiconductor heat dissipation structure according to some embodiments of the present disclosure.

Referring to FIG. 5A, the method for manufacturing the semiconductor package structure 1 includes providing a semiconductor device 11 including an active surface 11a and a back surface 11b opposite to the active surface 11a. A photoresist 51 is provided on the back surface 11b of the semiconductor device 11. An opening of the photoresist 51 is formed by a photolithograph operation. Subsequently, an etching operation is performed to form a groove 52.

Figure 5B:
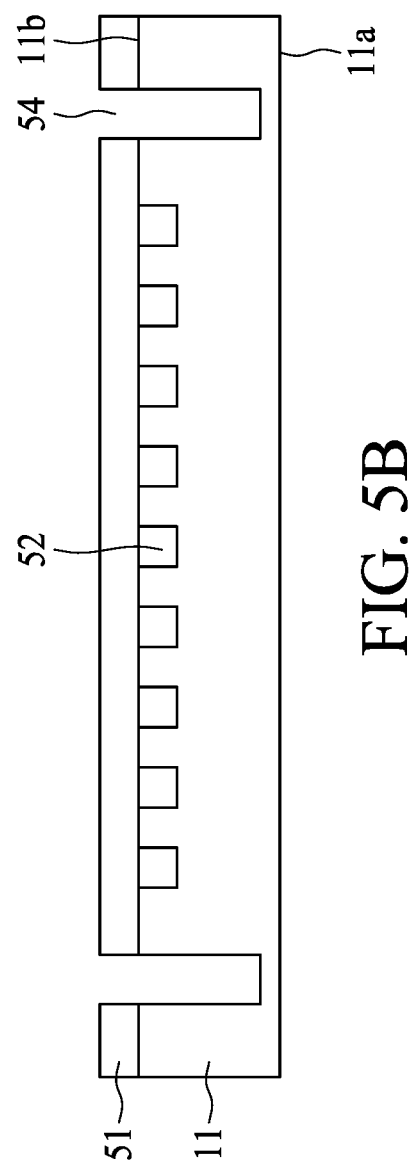

Referring to FIG. 5B, a photoresist 51 is further provided on the back surface 11b of the semiconductor device 11. An opening is formed by a photolithograph operation. Subsequently, an etching operation is performed to form a groove 54. A depth of the groove 54 is larger than that of the groove 52.

Figure 5C:
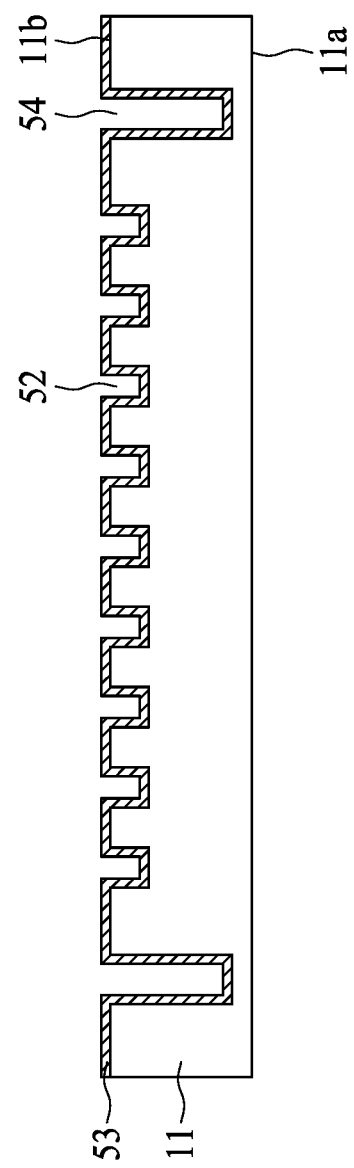

Referring to FIG. 5C, a seed layer 53 is formed on the back surface 11b of the semiconductor device 11 and in the grooves 52 and 54.

Figure 5D:
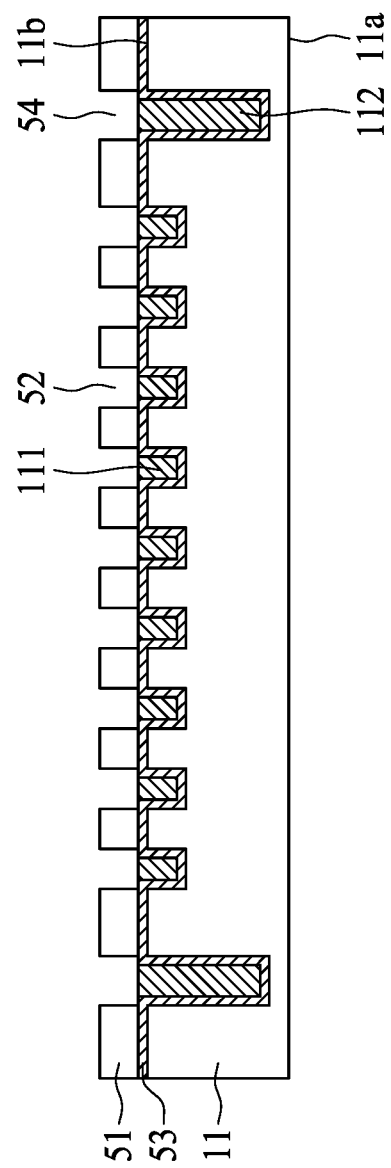

Referring to FIG. 5D, the photoresist 51 is provided on the back surface 11b of the semiconductor device 11. Heat conductive layers 111 and 112 are formed, for example, by a plating operation. The heat conductive layer 111 and the heat conductive layer 112 are formed in one piece. The heat conductive layer 111 fills the groove 52. The heat conductive layer 112 fills the groove 54. The heat conductive layers 111 and 112 may be a heat conductive material, e.g., metal.

Figure 5E:
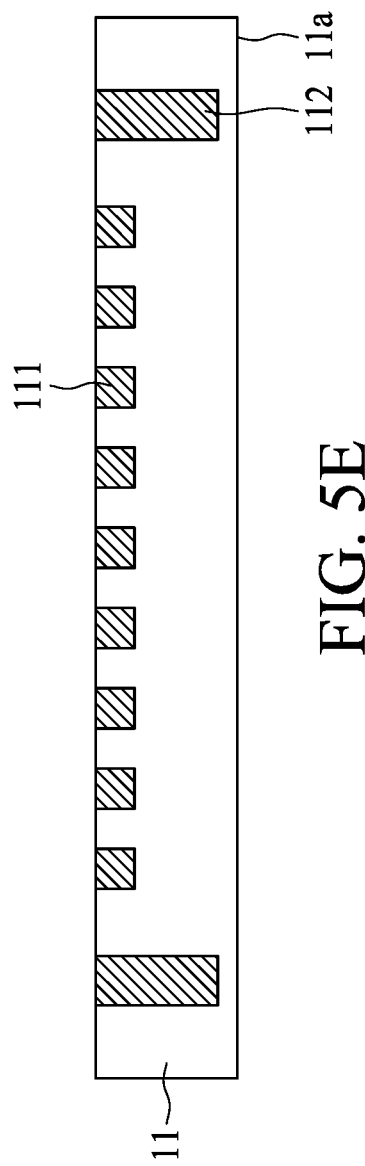

Referring to FIG. 5E, the seed layer 53 on the back surface 11b of the semiconductor device 11 are removed by an etching operation.

Figure 5F:
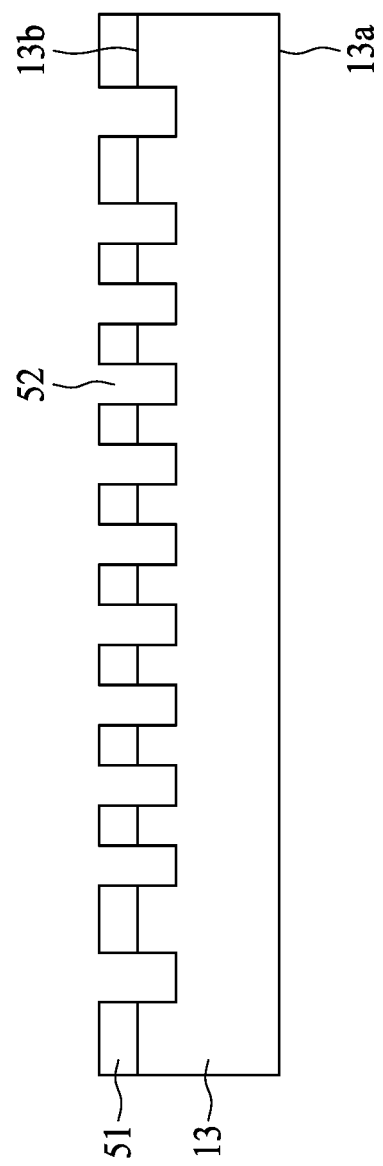

Referring to FIG. 5F, a semiconductor device 13 is provided. The semiconductor device 13 includes an active surface 13a and a back surface 13b opposite to the active surface 13a. The photoresist 51 is provided on the back surface 13b of the semiconductor device 13. An opening of the photoresist 51 is formed by a photolithograph operation. Subsequently, an etching operation is performed to form a groove 52.

Figure 5G:
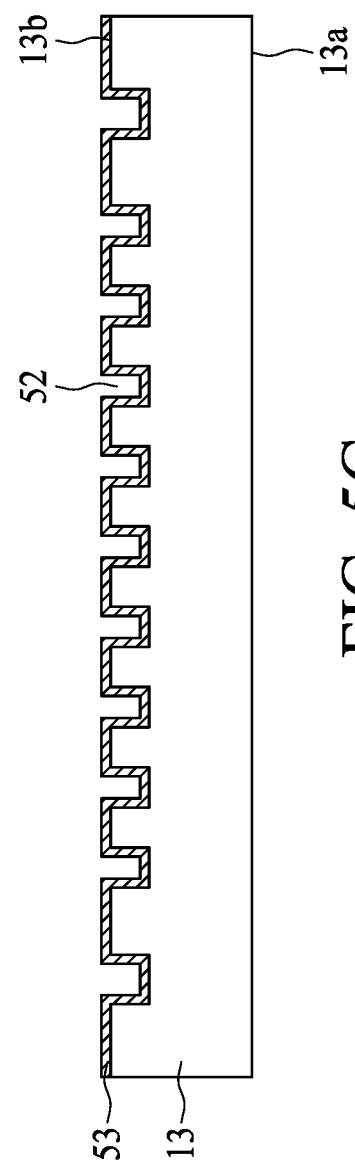

Referring to FIG. 5G, the seed layer 53 is formed on the back surface 11b of the semiconductor device 11 and in the groove 52.

Figure 5H:
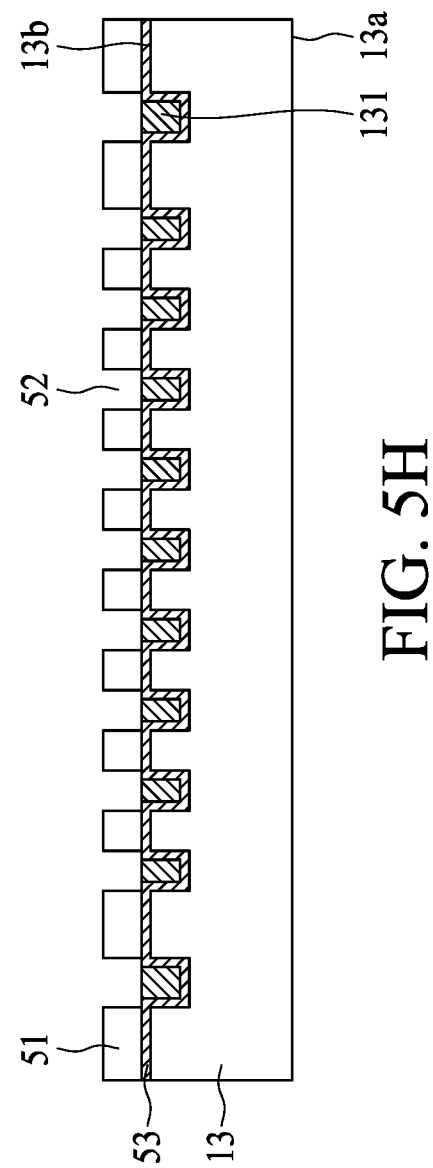

Referring to FIG. 5H, the photoresist 51 is provided on the back surface 11b of the semiconductor device 11. A heat conductive layer 131 is formed, for example, by a plating operation. The heat conductive layer 131 fills the groove 52. The conductive layer 131 may be a heat conductive material, e.g., metal.

Figure 5I:

Referring to FIG. 5I, the seed layer 53 on the back surface 13b of the semiconductor device 13 are removed by an etching operation.

Figure 5J:
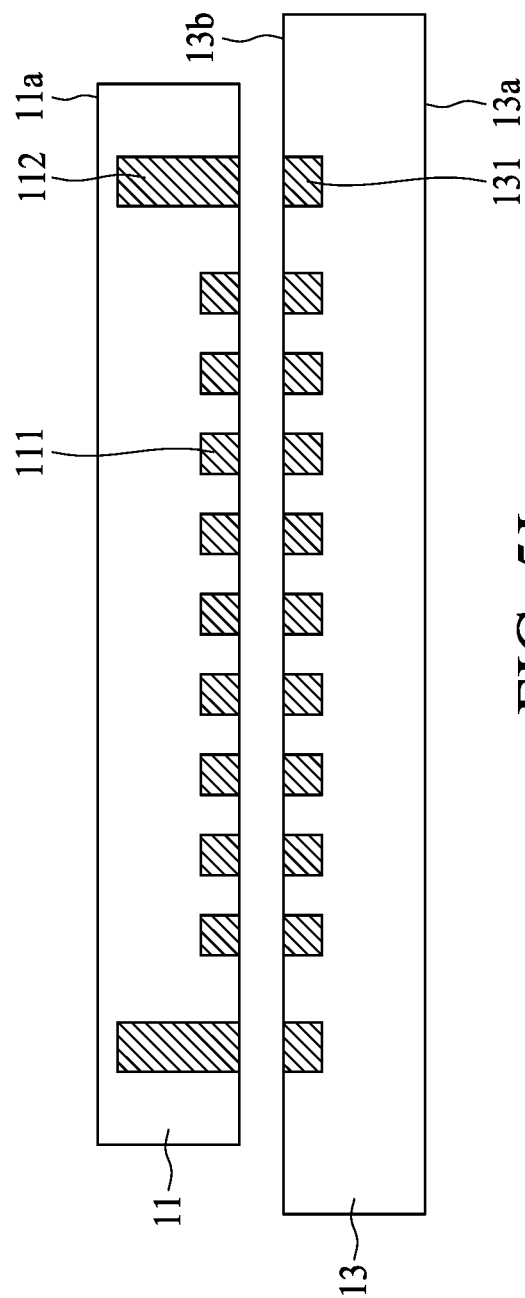

Referring to FIG. 5J, the semiconductor device 11 is aligned with the semiconductor device 13. The semiconductor device 11 is bonded to the semiconductor device 13 through a wafer-to-wafer bonding operation. The back surface 11b of the semiconductor device 11 is directly in contact with the back surface 13b of the semiconductor device 13. The conductive layer 111 is directly in contact with the conductive layer 131.

Figure 5K:
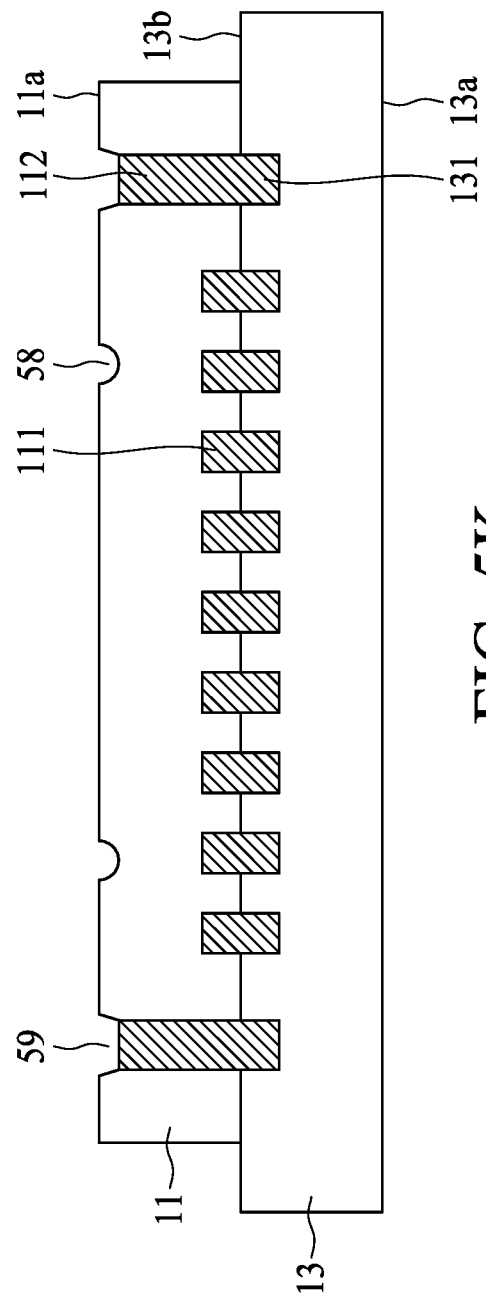

Referring to FIG. 5K, a groove 59 is formed on the active surface 11a of the semiconductor device 11 to expose the heat conductive layer 112. In some embodiments, a groove 58 may be formed to expose an electrical contact of the semiconductor device 11.

Figure 5L:
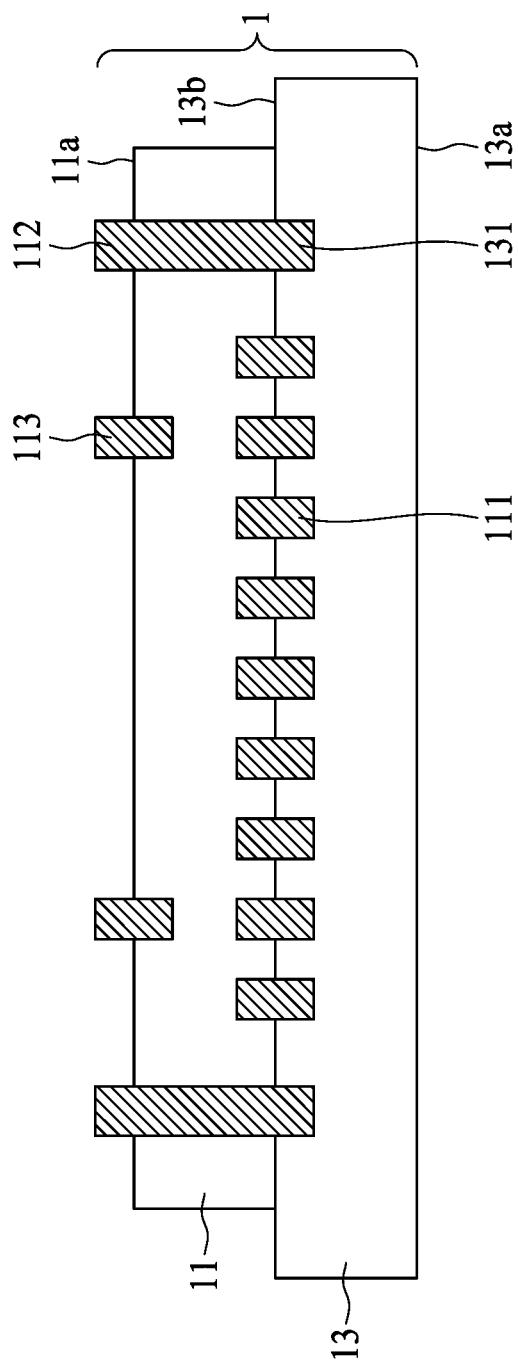

Referring to FIG. 5L, a conductive pillar are formed or disposed in the grooves 58 and 59, for example, by a plating operation. The conductive pillar in the groove 59 constitutes a part of the heat conductive layer 112 and the conductive pillar in the groove 58 (e.g., conductive pillar 113) electrically connects to the semiconductor device 11. Accordingly, the semiconductor heat dissipation structure 1 is formed.

FIG. 6A through FIG. 6G illustrate some embodiments of a method of manufacturing a semiconductor package structure 2 according to some embodiments of the present disclosure. Various figures have been simplified to more clearly present aspects of the present disclosure.

Figure 6A:
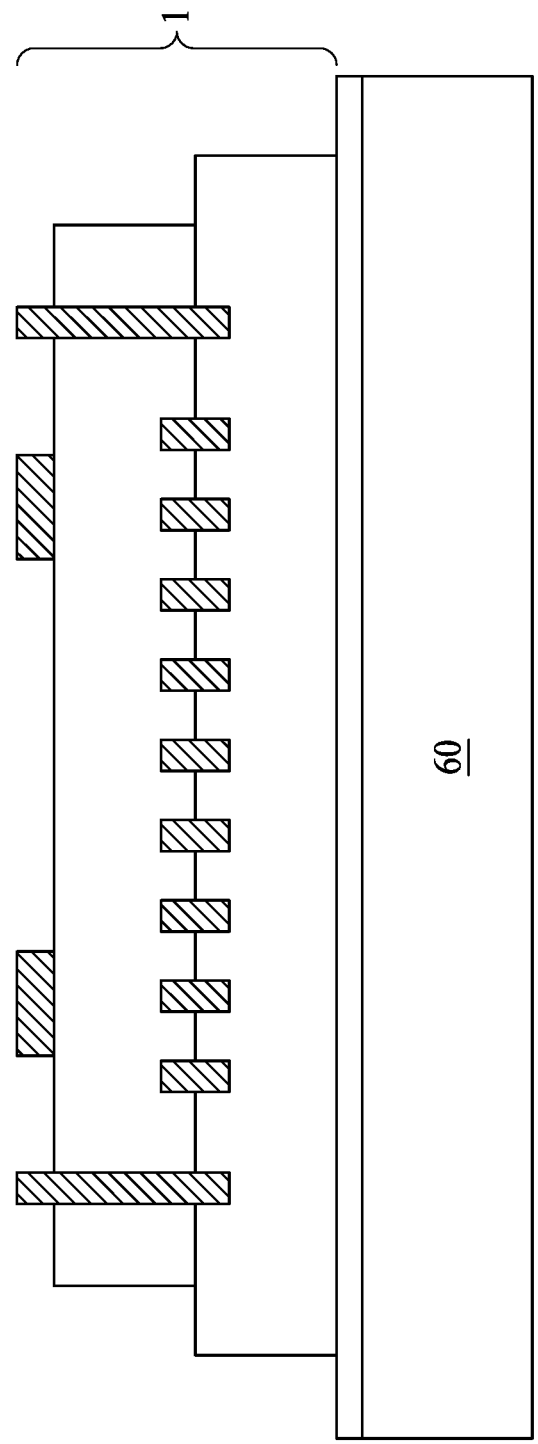
FIG. 6A, FIG. 6B, FIG. 6C, FIG. 6D, FIG. 6E, FIG. 6F, and FIG. 6G illustrate intermediate operations of a method for manufacturing a semiconductor package structure according to some embodiments of the present disclosure.

Referring to FIG. 6A, the method for manufacturing the semiconductor package structure 2 includes providing a carrier 60. The semiconductor heat dissipation structure 1 is disposed on the carrier 60.

Figure 6B:
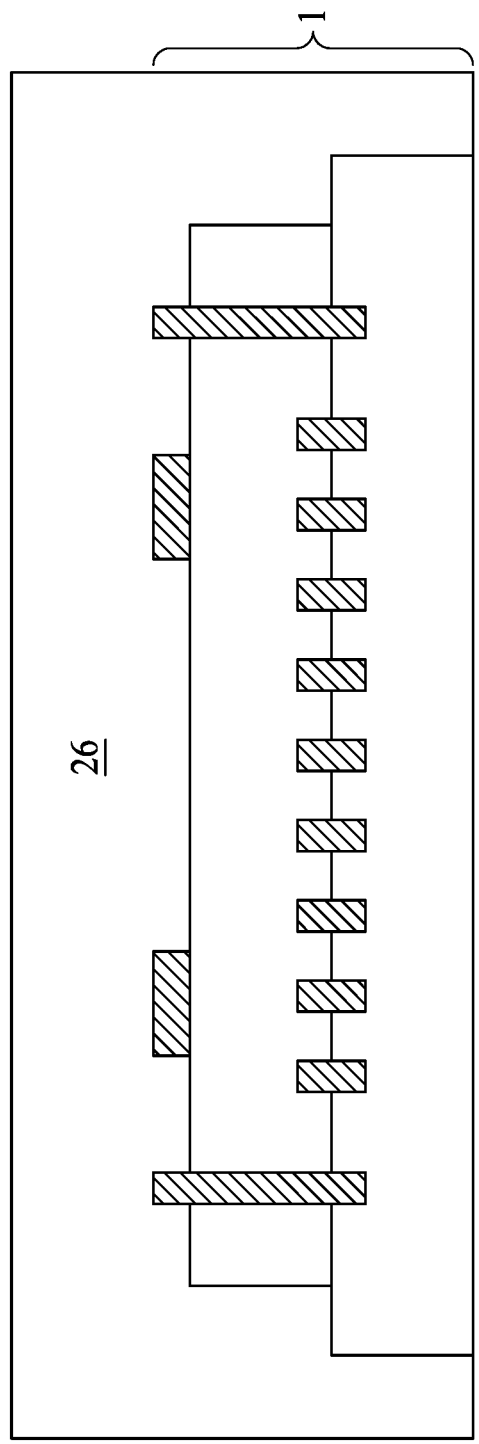

Referring to FIG. 6B, an encapsulant 26 is formed on the carrier 60. The semiconductor heat dissipation structure 1 is encapsulated by the encapsulant 26. The carrier 60 is then removed.

Figure 6C:
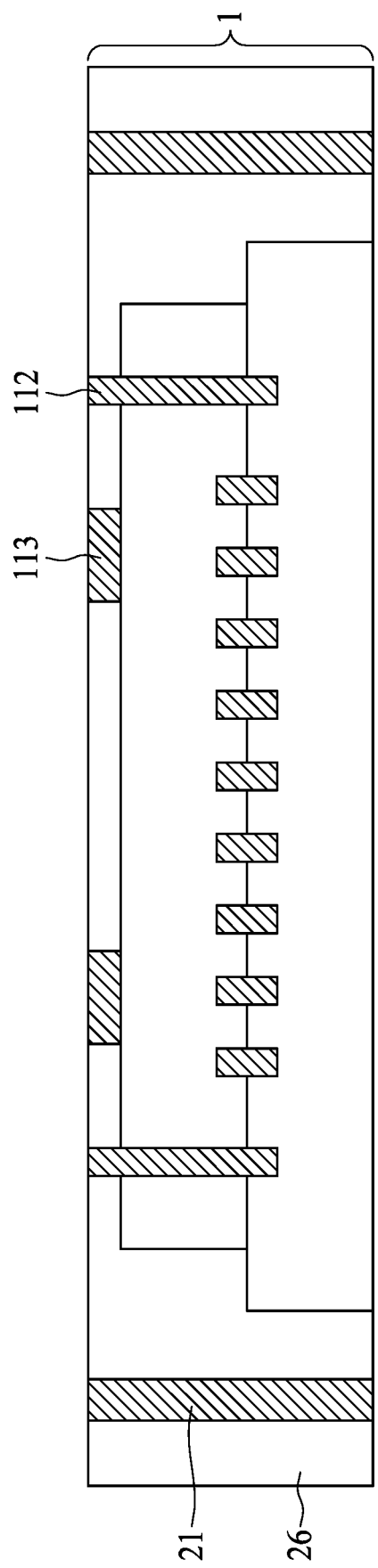

Referring to FIG. 6C, the encapsulant 26 is grinded to expose a top surface of the conductive pillar 113 and a top surface of the heat conductive layer 112. Then, an interconnection element 21 is formed in the encapsulant 26 and penetrating through the encapsulant 26.

Figure 6D:
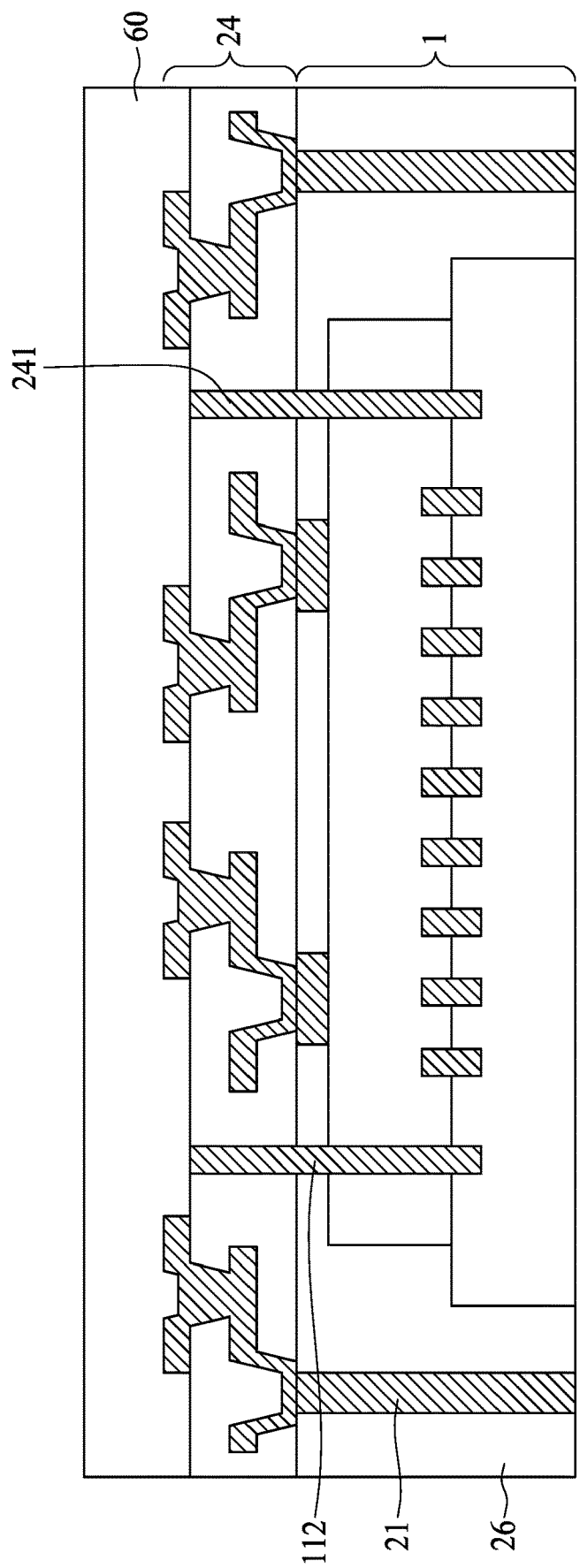

Referring to FIG. 6D, an RDL 24 is disposed on the semiconductor heat dissipation structure 1. The RDL 24 includes a heat connection element 241. The heat connection element 241 penetrates through the RDL 24 and is in contact with the heat conductive layer 112. The heat connection element 241 may include Cu, Au, or other suitable materials. Then, the carrier 60 is disposed on the RDL 24.

Figure 6E:
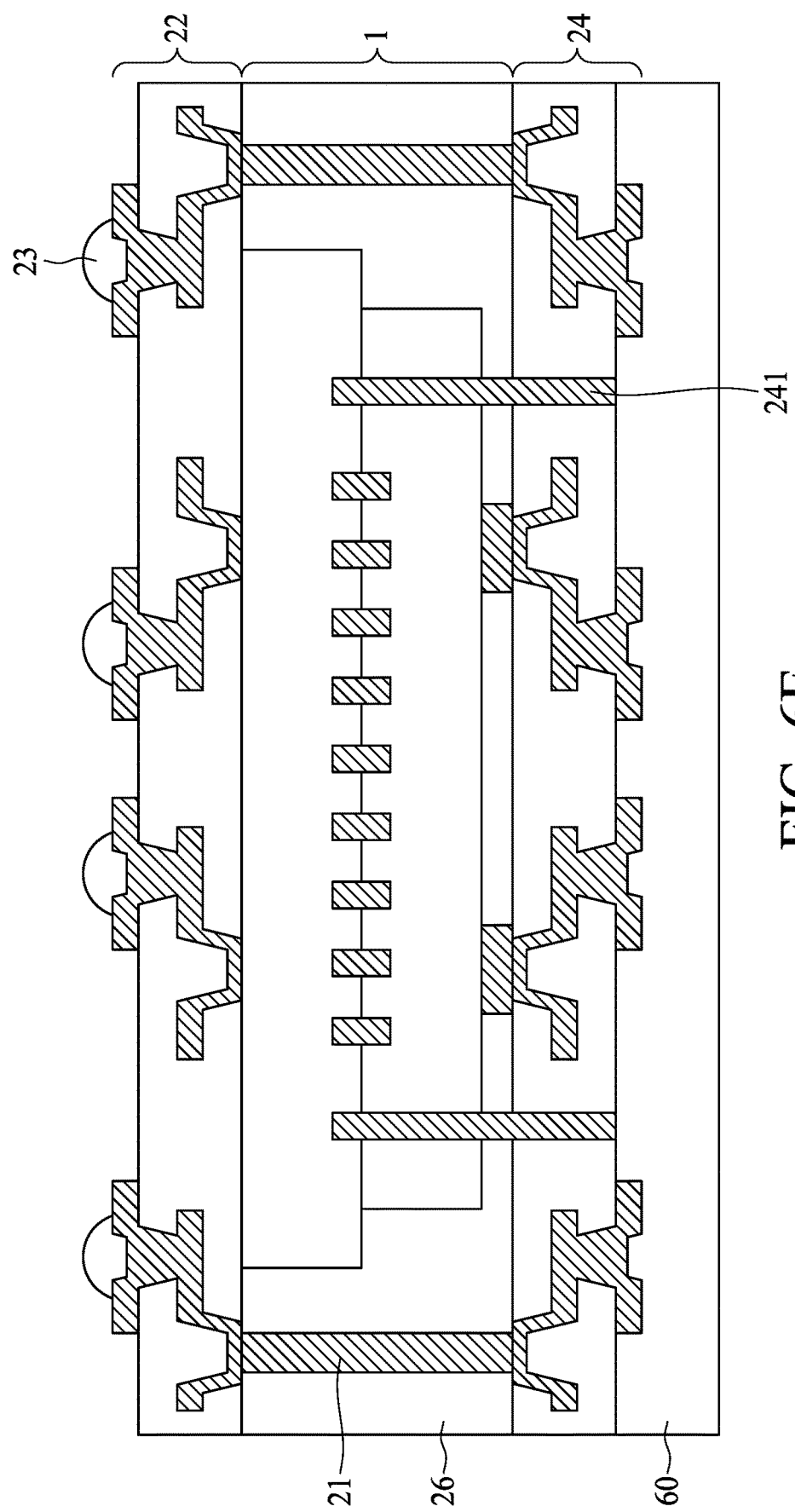

Referring to FIG. 6E, an RDL 22 is disposed on the semiconductor heat dissipation structure 1 opposite to the RDL 24. In some embodiments, an electrical connection element 23 is disposed on the RDL 22. The electrical connection elements 23 may be a solder ball.

Figure 6F:
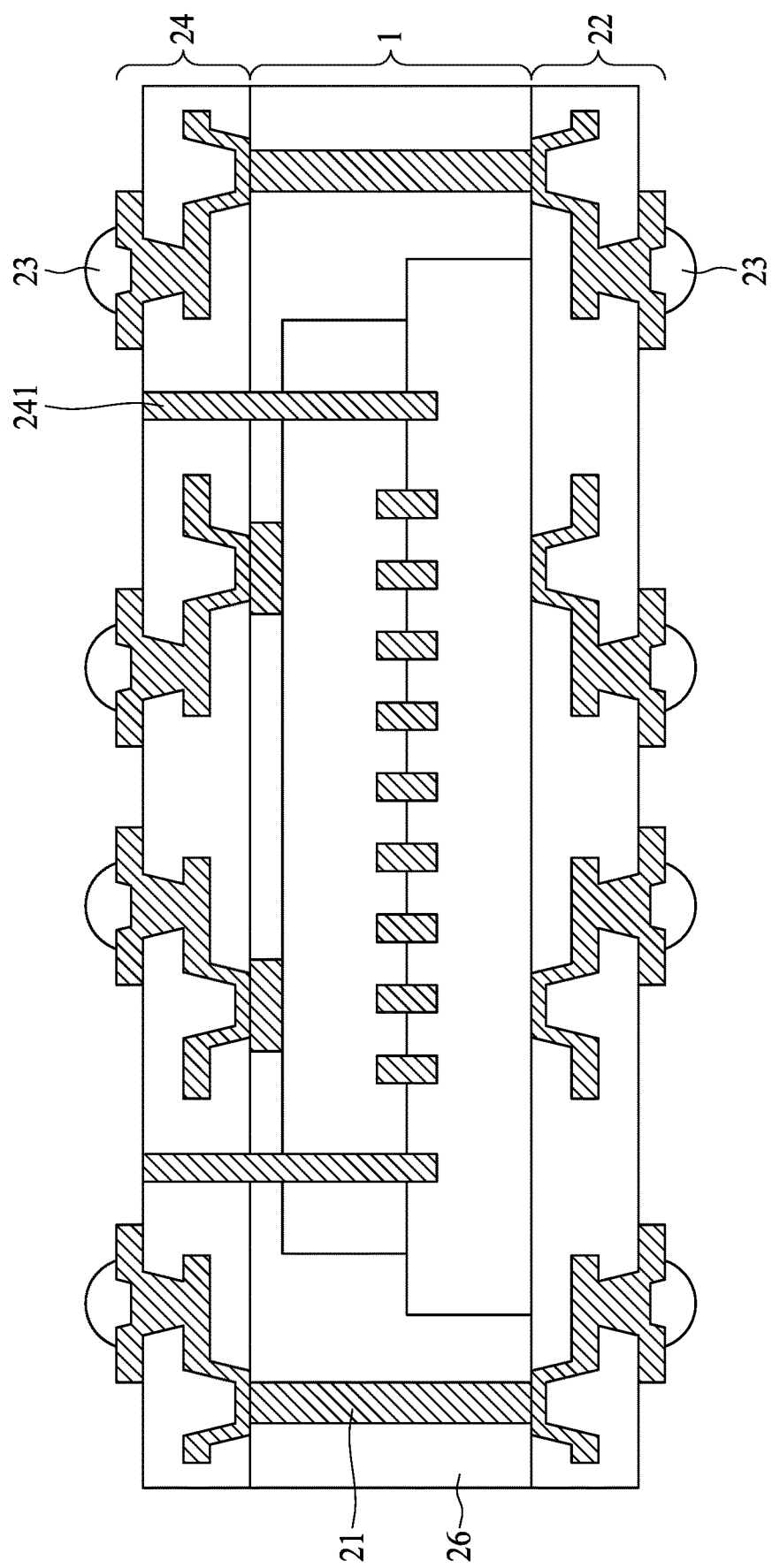

Referring to FIG. 6F, the carrier 60 is removed. Then, an electrical connection element 23 is disposed on the RDL 24.

Figure 6G:
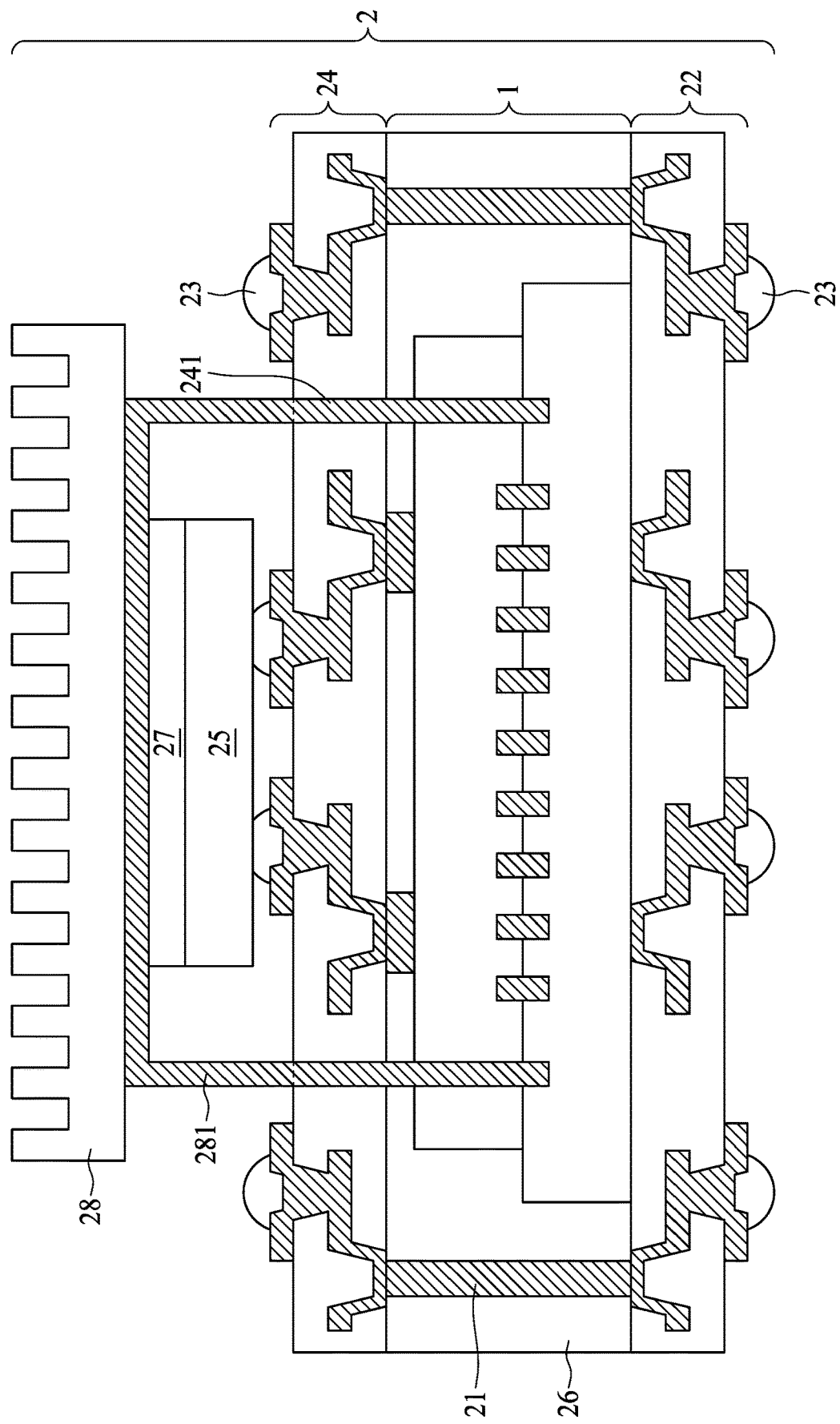

Referring to FIG. 6G, a semiconductor device 25 is disposed on the RDL 24 and electrically connected to the RDL 24 via the electrical connection elements 23. A heat connection element 281 is disposed on the RDL 24 and connected to the heat connection element 241. The heat connection element 281 may be made of metal or alloy or any suitable heat conductive material and may have any suitable shape. In some embodiment, the heat connection element 281 is a metal lid.

A heat dissipation device 28 is disposed over the RDL 24. In some embodiments, the heat dissipation device 28 is disposed on the heat connection element 281. The heat connection element 281 is aligned with the heat connection element 241 and may be electrically connected to the heat connection element 241. A heat dissipation paste 27 may be disposed on a top surface (e.g., the back surface) of the semiconductor device 25. The heat dissipation paste 27 may be disposed between the semiconductor device 25 and the heat dissipation device 28. Accordingly, the semiconductor package structure 2 is formed.

FIG. 7A through FIG. 7G illustrate some embodiments of a method of manufacturing a semiconductor heat dissipation structure 1' according to some embodiments of the present disclosure. The operations of FIG. 7A through FIG. 7G are similar to those of FIG. 5A through FIG. 5J. Various figures have been simplified to more clearly present aspects of the present disclosure.

Figure 7A:
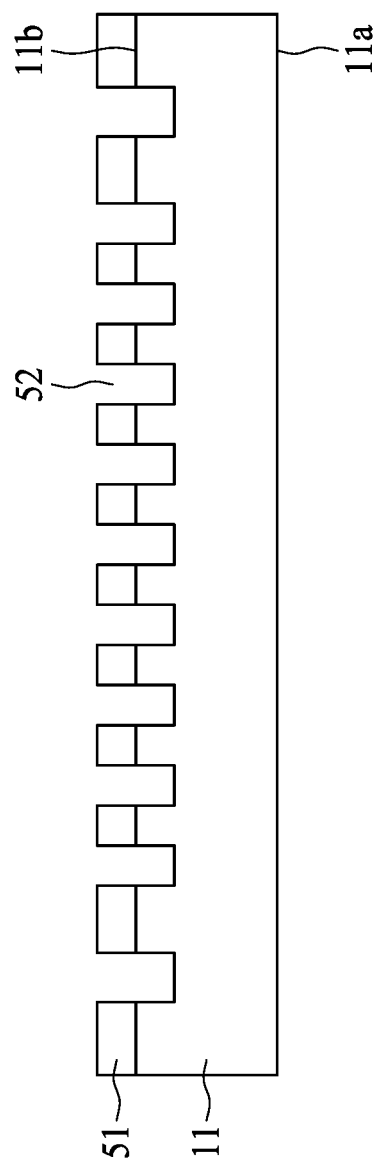
FIG. 7A, FIG. 7B, FIG. 7C, FIG. 7D, FIG. 7E, FIG. 7F, and FIG. 7G illustrate intermediate operations of a method for manufacturing a semiconductor heat dissipation structure according to some embodiments of the present disclosure.

Referring to FIG. 7A, the method for manufacturing the semiconductor package structure 1' includes providing a semiconductor device 11 including an active surface 11a and a back surface 11b opposite to the active surface 11a. A photoresist 51 is provided on the back surface 11b of the semiconductor device 11. An opening of the photoresist 51 is formed by a photolithograph operation. Subsequently, an etching operation is performed to form a groove 52.

Figure 7B:
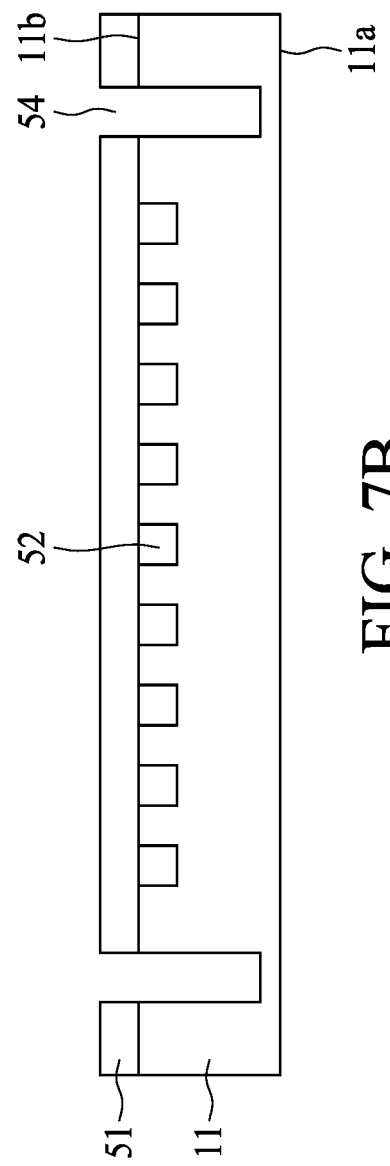

Referring to FIG. 7B, a photoresist 51 is further provided on the back surface 11b of the semiconductor device 11. An opening is formed by a photolithograph operation. Subsequently, an etching operation is performed to form a groove 54. A depth of the groove 54 is larger than that of the groove 52.

Figure 7C:
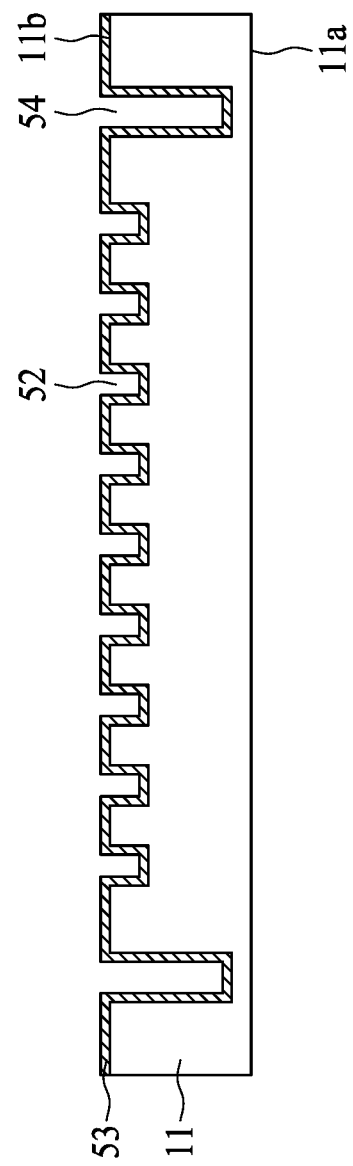

Referring to FIG. 7C, a seed layer 53 is formed on the back surface 11b of the semiconductor device 11 and in the grooves 52 and 54.

Figure 7D:
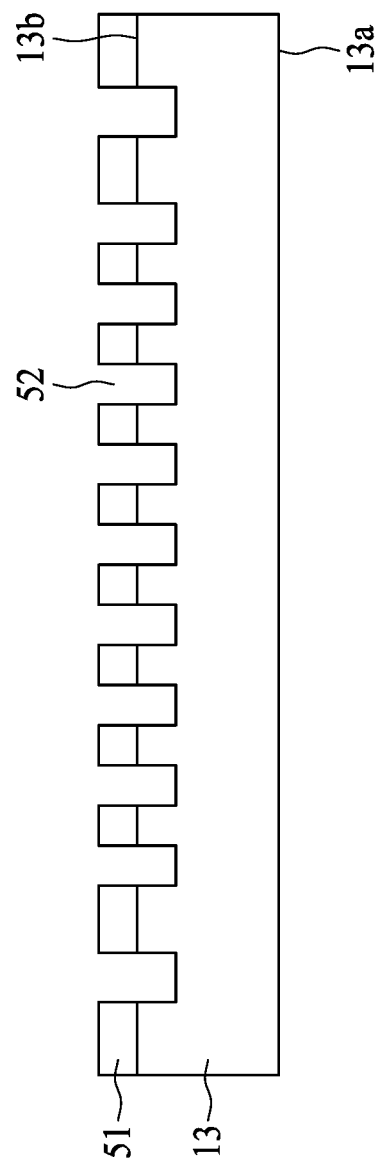

Referring to FIG. 7D, a semiconductor device 13 is provided. The semiconductor device 13 includes an active surface 13a and a back surface 13b opposite to the active surface 13a. The photoresist 51 is provided on the back surface 13b of the semiconductor device 13. An opening of the photoresist 51 is formed by a photolithograph operation. Subsequently, an etching operation is performed to form a groove 52.

Figure 7E:
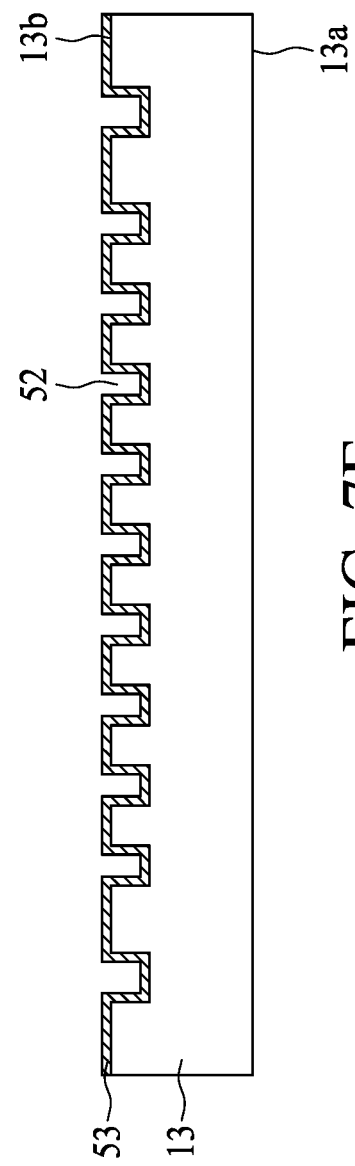

Referring to FIG. 7E, the seed layer 53 is formed on the back surface 11b of the semiconductor device 11 and formed in the groove 52.

Figure 7F:
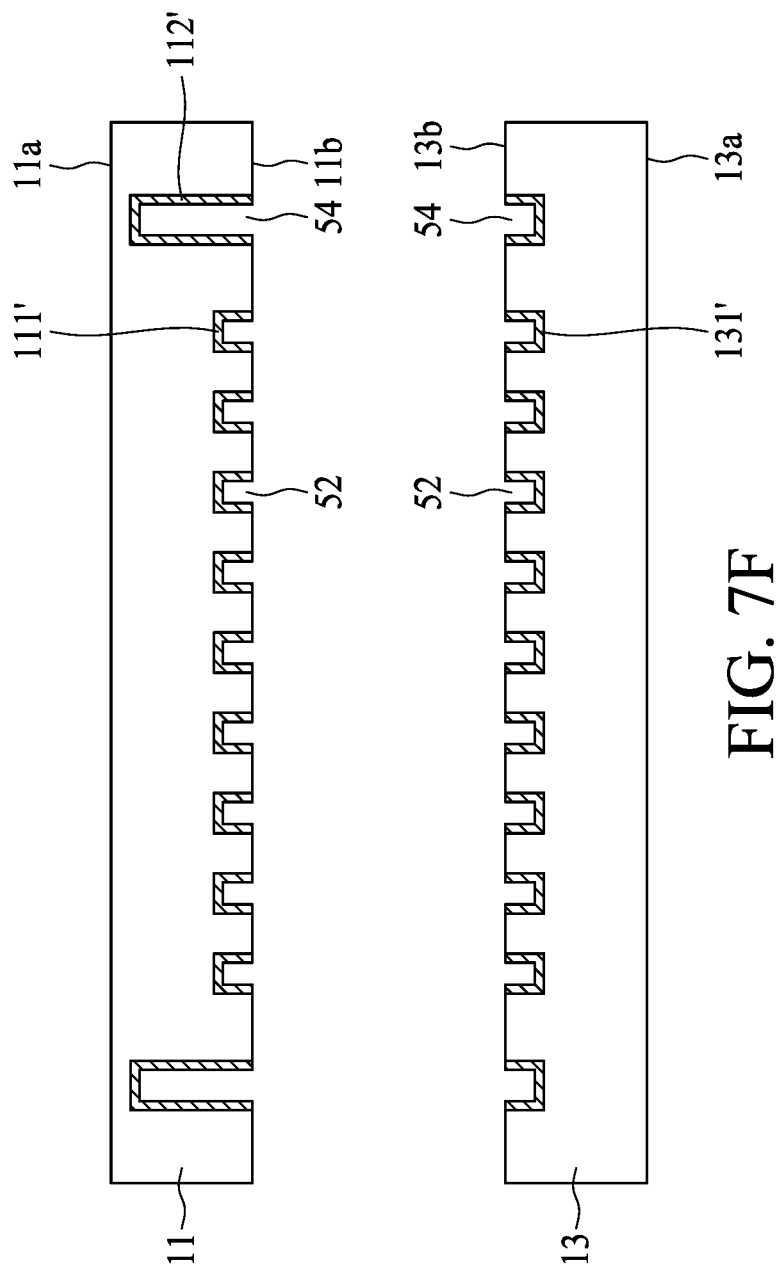

Referring to FIG. 7F, the seed layer 53 on the back surface 11b of the semiconductor device 11 are removed by an etching operation so as to form a conductive layer 111' and a conductive layer 112'. Also, the seed layer 53 on the back surface 13b of the semiconductor device 13 is removed by an etching operation so as to form a conductive layer 131'. The semiconductor device 11 is aligned with to the semiconductor device 13.

Figure 7G:
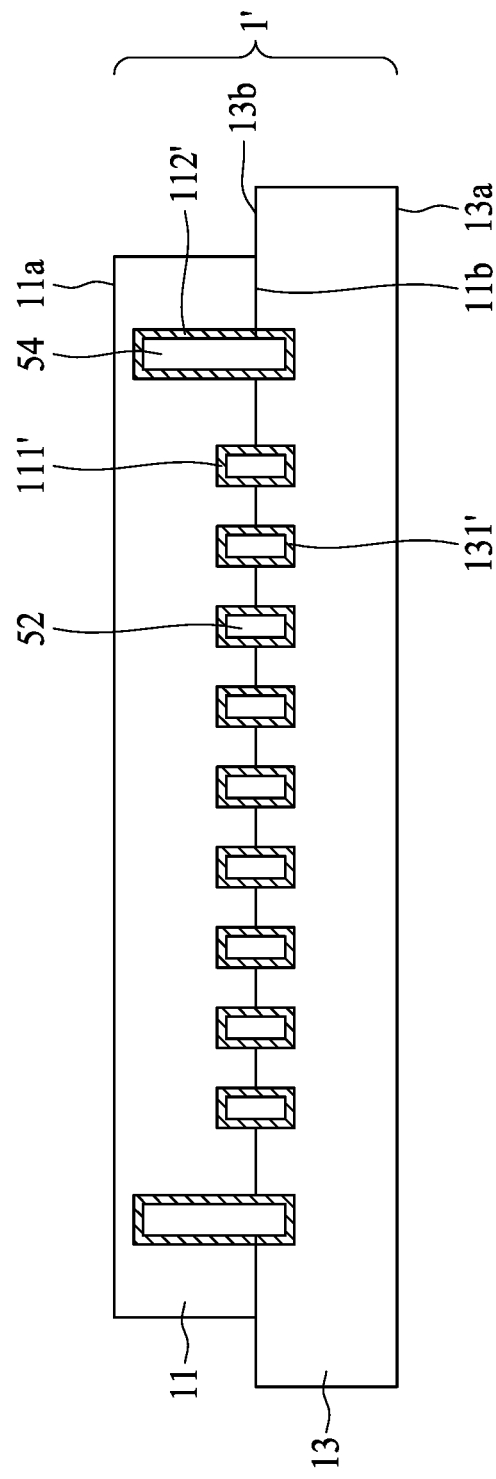

Referring to FIG. 7G, the semiconductor device 11 is bonded to the semiconductor device 13 through a wafer-to-wafer bonding operation. The back surface 11b of the semiconductor device 11 is directly in contact with the back surface 13b of the semiconductor device 13. The conductive layer 111' is directly in contact with the conductive layer 131'. Accordingly, the semiconductor heat dissipation structure 1' is formed.

FIG. 8A through FIG. 8J illustrate some embodiments of a method of manufacturing a semiconductor package structure 2' according to some embodiments of the present disclosure. Various figures have been simplified to more clearly present aspects of the present disclosure.

Figure 8A:
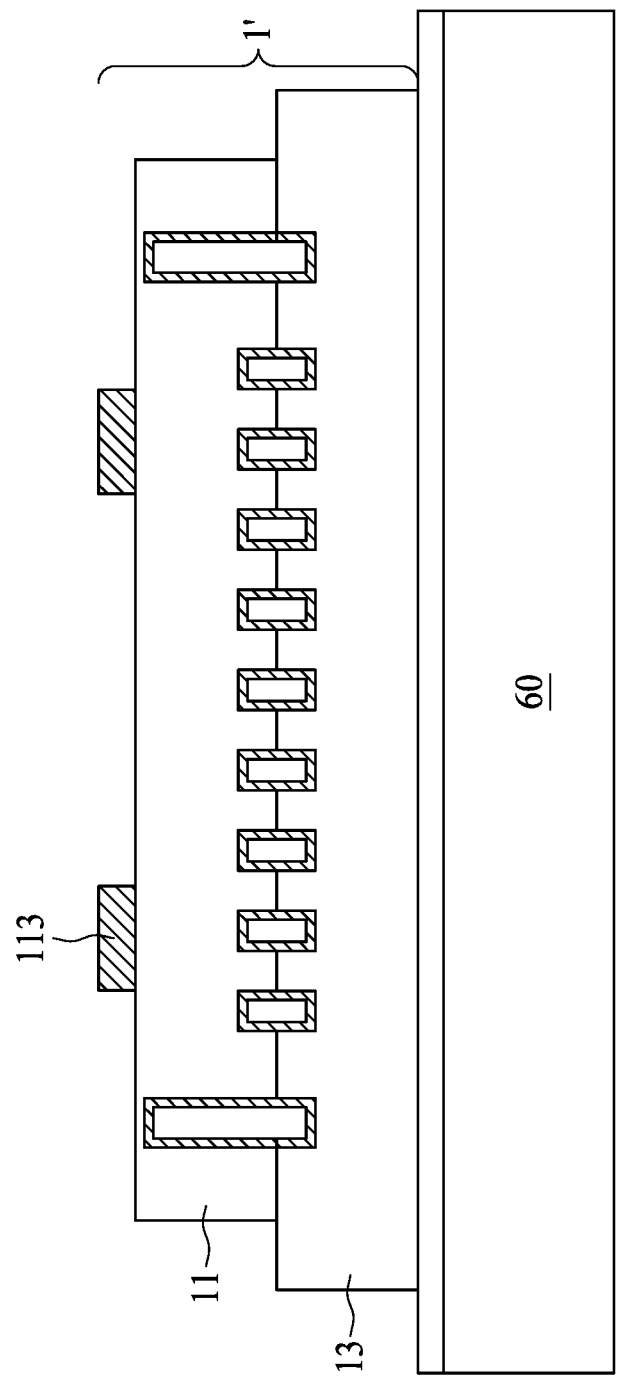
FIG. 8A, FIG. 8B, FIG. 8C, FIG. 8D, FIG. 8E, FIG. 8F, FIG. 8G, FIG. 8H, FIG. 8I, and FIG. 8J illustrate intermediate operations of a method for manufacturing a semiconductor package structure according to some embodiments of the present disclosure.

Referring to FIG. 8A, the method for manufacturing the semiconductor package structure 2' includes providing a carrier 60. The semiconductor heat dissipation structure 1' is disposed on the carrier 60. A conductive pillar 113 is formed on and electrically connected to the semiconductor device 11.

Figure 8B:
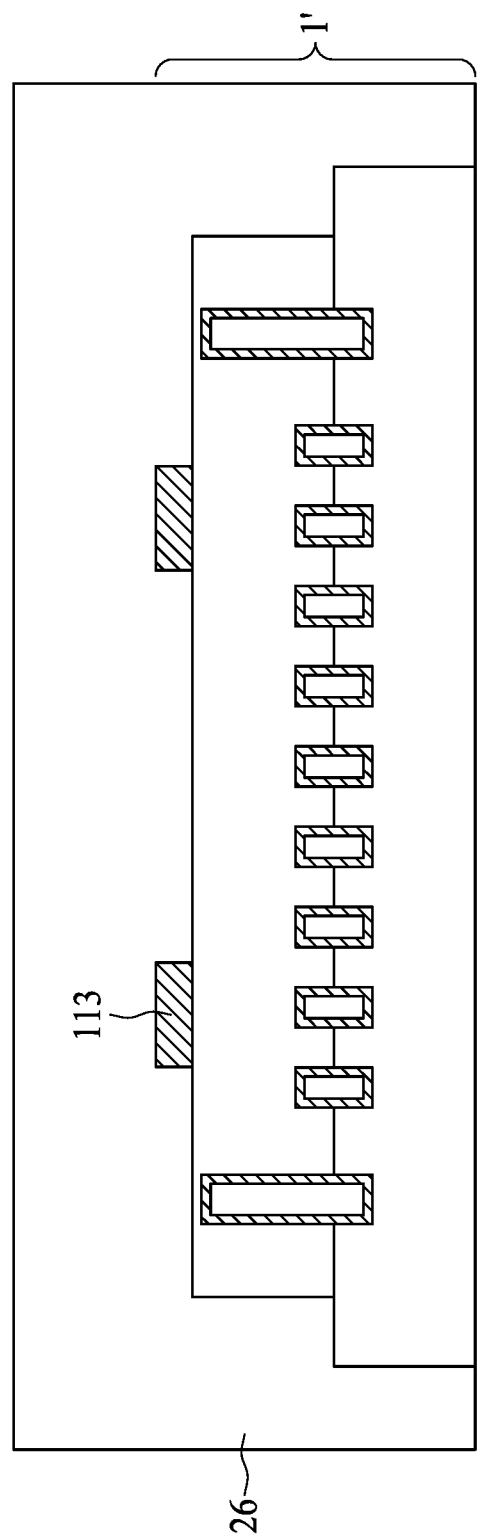

Referring to FIG. 8B, an encapsulant 26 is formed on the carrier 60. The semiconductor heat dissipation structure 1' is entirely encapsulated by the encapsulant 26. Subsequently, the carrier 60 is removed.

Figure 8C:
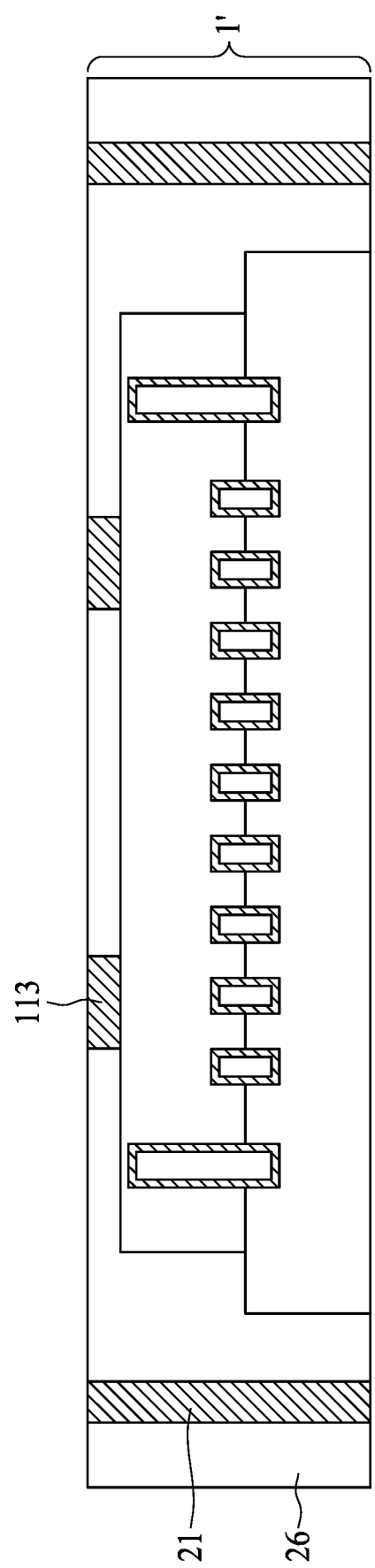

Referring to FIG. 8C, the encapsulant 26 is grinded to expose a top surface of the conductive pillar 113. Then, an interconnection element 21 is formed in the encapsulant 26 and penetrating through the encapsulant 26.

Figure 8D:
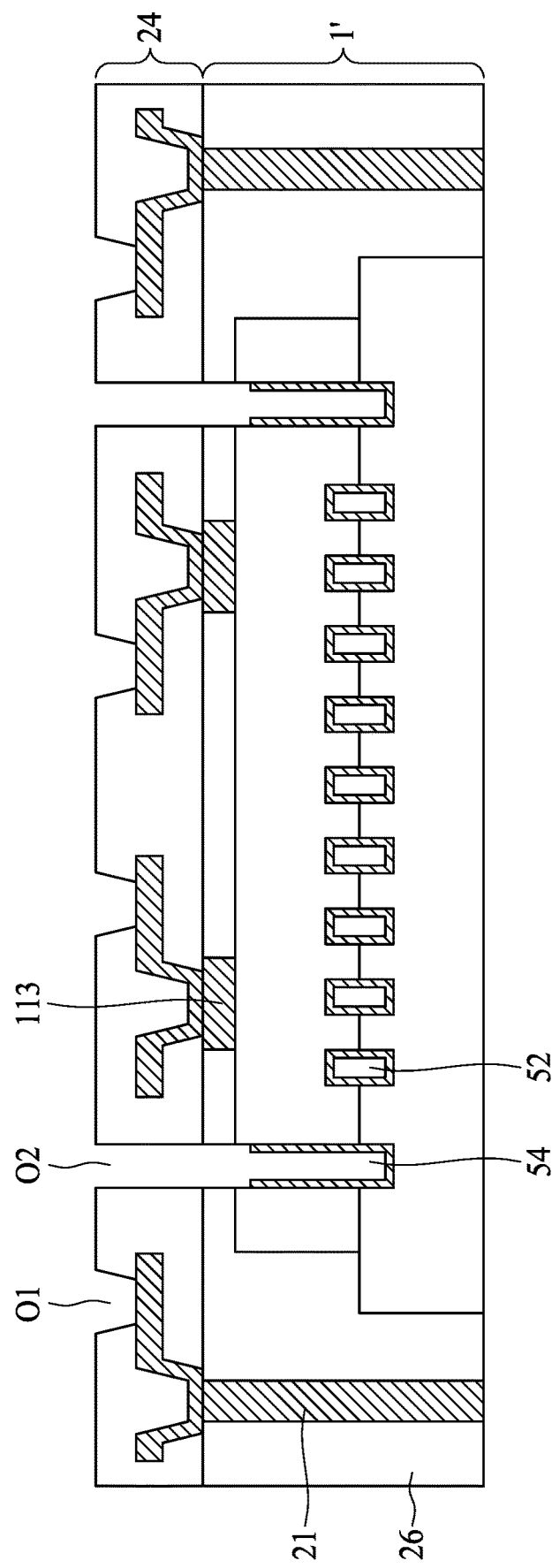

Referring to FIG. 8D, An RDL 24 is disposed on the semiconductor heat dissipation structure 1. An opening O1 is formed to expose the traces or electrical contacts of the RDL 24. An opening O2 is formed to expose the groove 54 and the seed layer disposed in the groove 54. The opening O2 may be formed in several steps (e.g., by a first step of forming an opening penetrating the encapsulant 26 before the formation of the RDL 24, and a second step of forming an opening penetrating the RDL 24) or formed integrally in a single step (e.g., by a step of forming an opening penetrating the RDL 24 and the encapsulant 26).

Figure 8E:
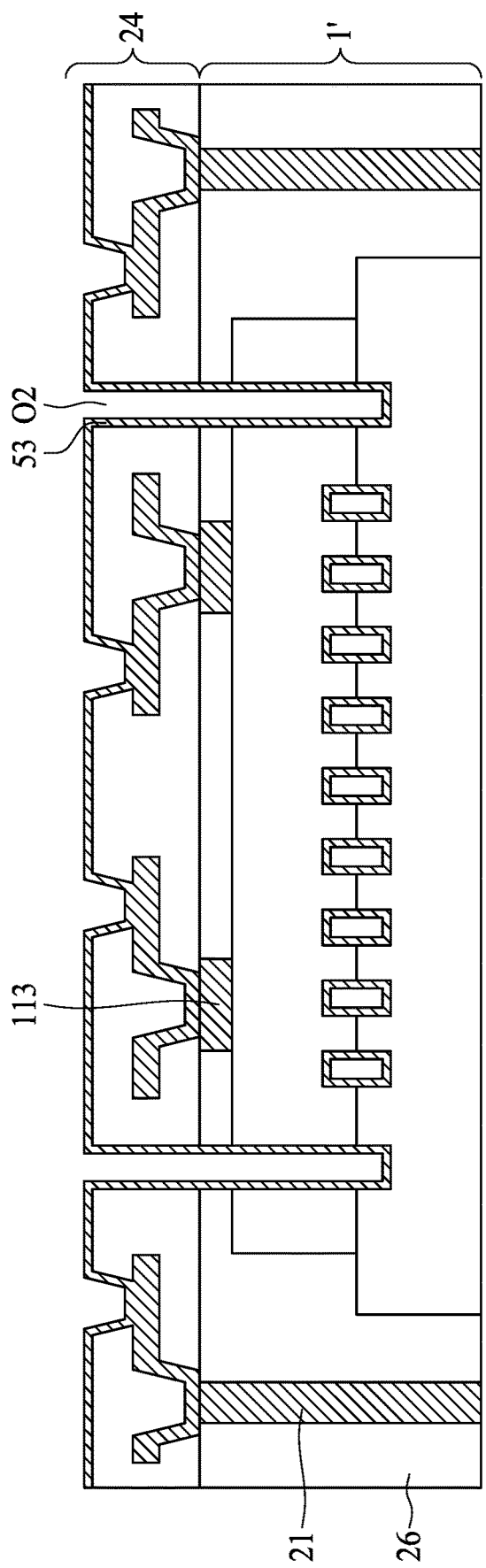

Referring to FIG. 8E, a seed layer 53 is formed on the RDL 24, in the opening O1 and in the opening O2. The seed layer 53 is formed in an opening 62 of the RDL 24.

Figure 8F:
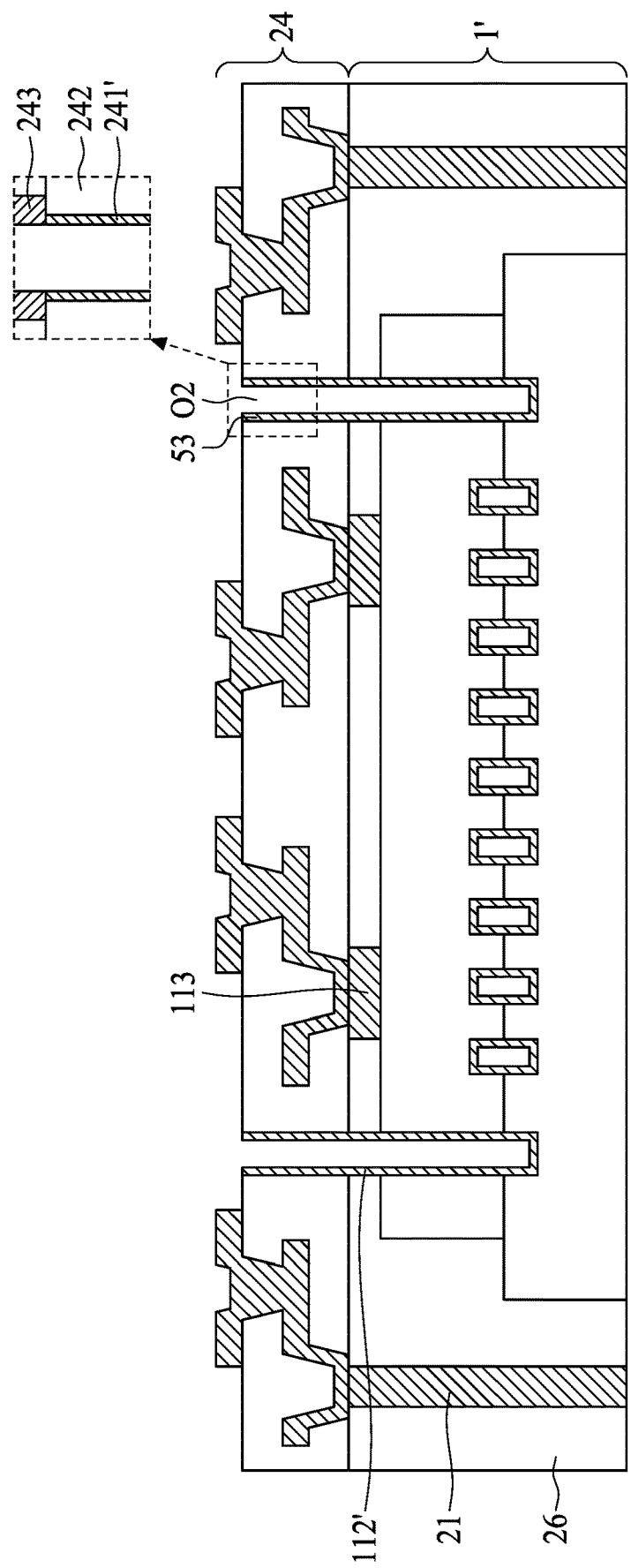

Referring to FIG. 8F, the seed layer 53 on the surface of the RDL 24 is removed and a conductive via is formed in the opening O1. A hollow heat connection element 241' is formed in the opening O2 of the RDL 24. The hollow heat connection element 241' is directly in contact with the heat conductive layer 112'. A conductive element 243 may be formed and left on a periphery of the opening O2. The conductive element 243 is connected to the hollow heat connection element 241' and may be used for fastening a hollow heat connection element 281' which will be discussed below.

Figure 8G:
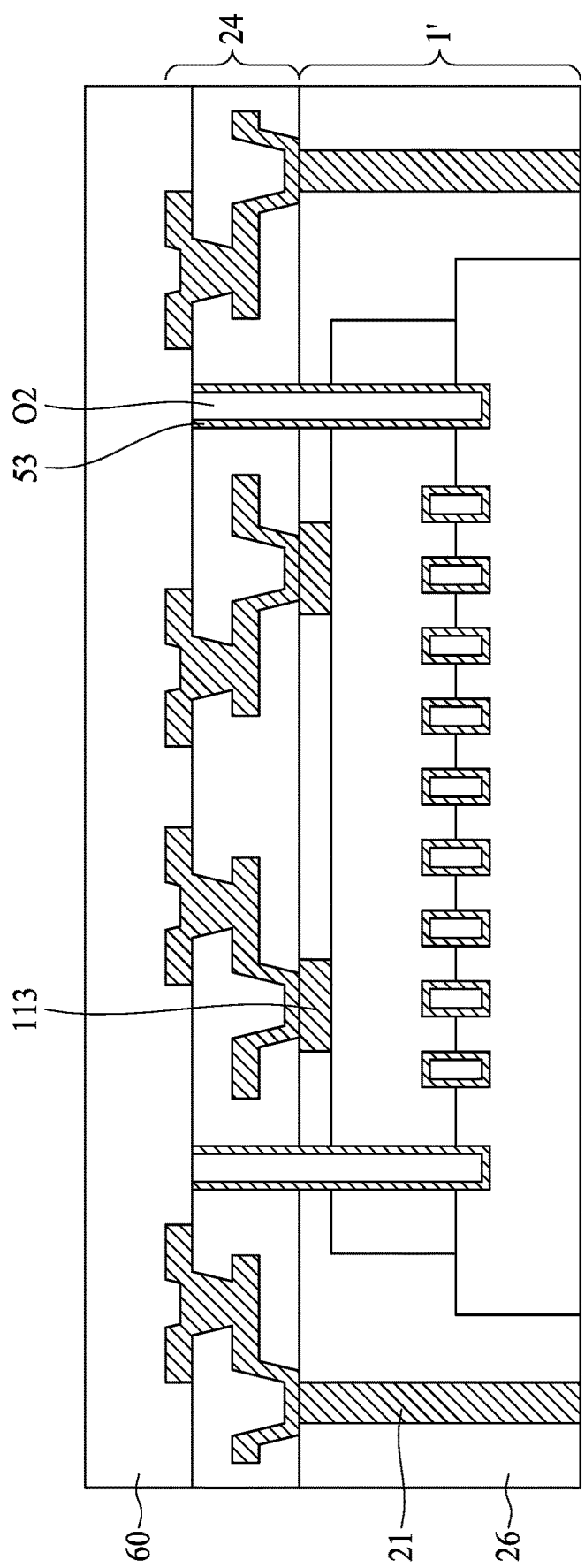

Referring to FIG. 8G, the carrier 60 is disposed on the RDL 24.

Figure 8H:
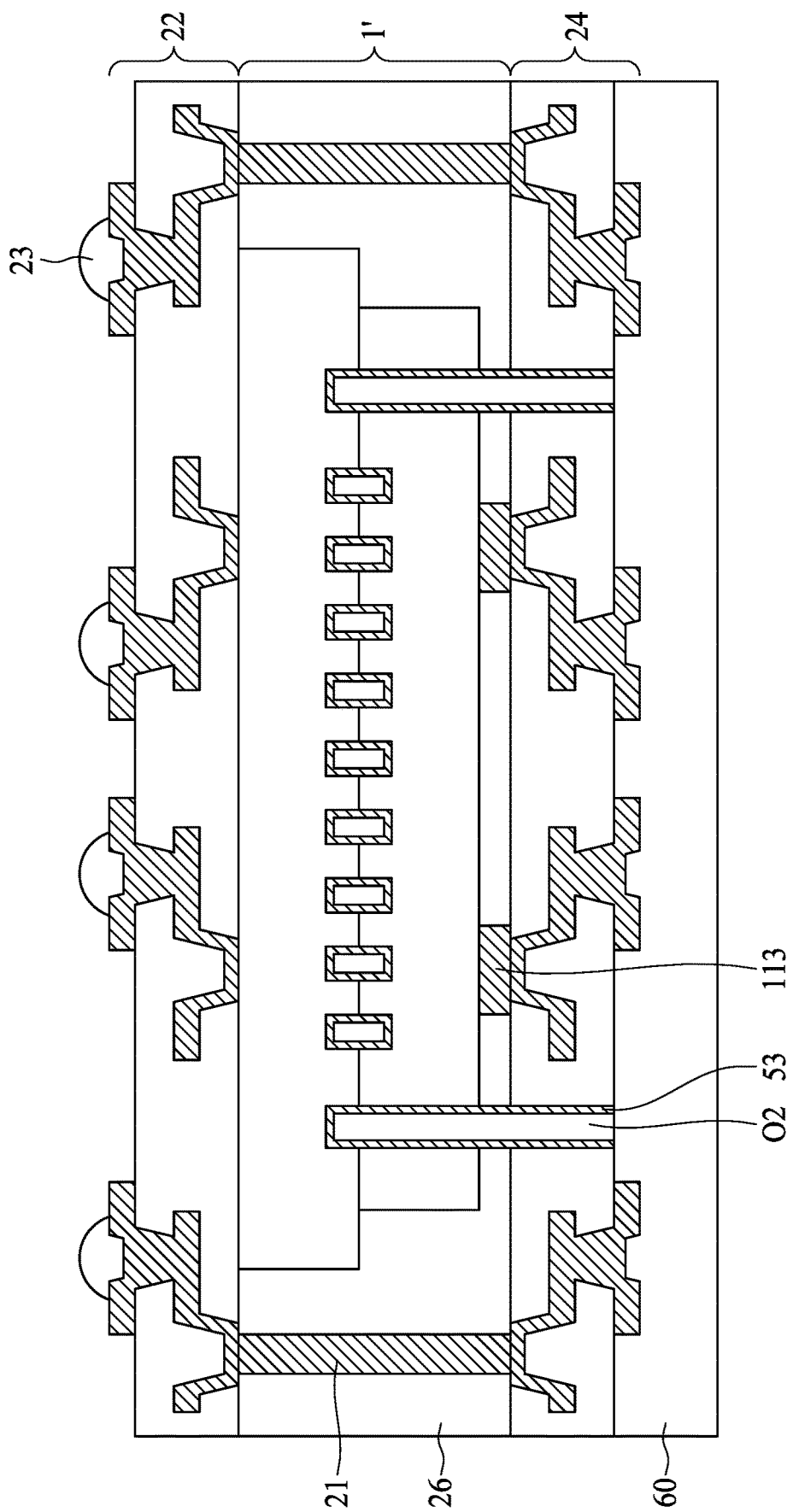

Referring to FIG. 8H, a RDL 22 is disposed on the semiconductor heat dissipation structure 1' opposite to the RDL 24. In some embodiments, an electrical connection element 23 is disposed on the RDL 22. The electrical connection elements 23 may be a solder ball.

Figure 8I:
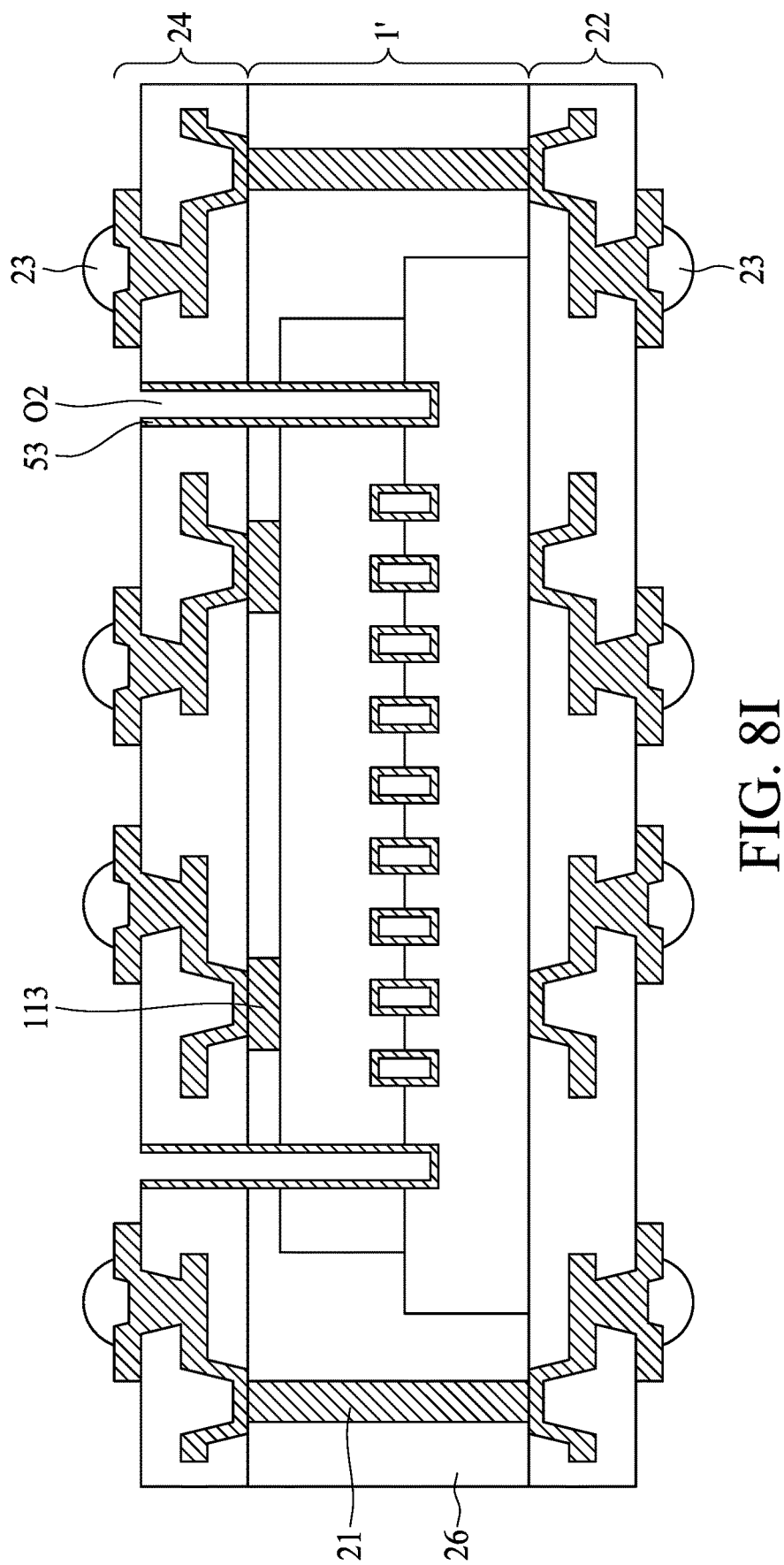

Referring to FIG. 8I, the carrier 60 is removed. Then, an electrical connection element 23 is disposed on the RDL 24.

In some embodiments, a cooling liquid (such as water, alcohol), refrigerant or coolant may be added from the opening O2.

Figure 8J:
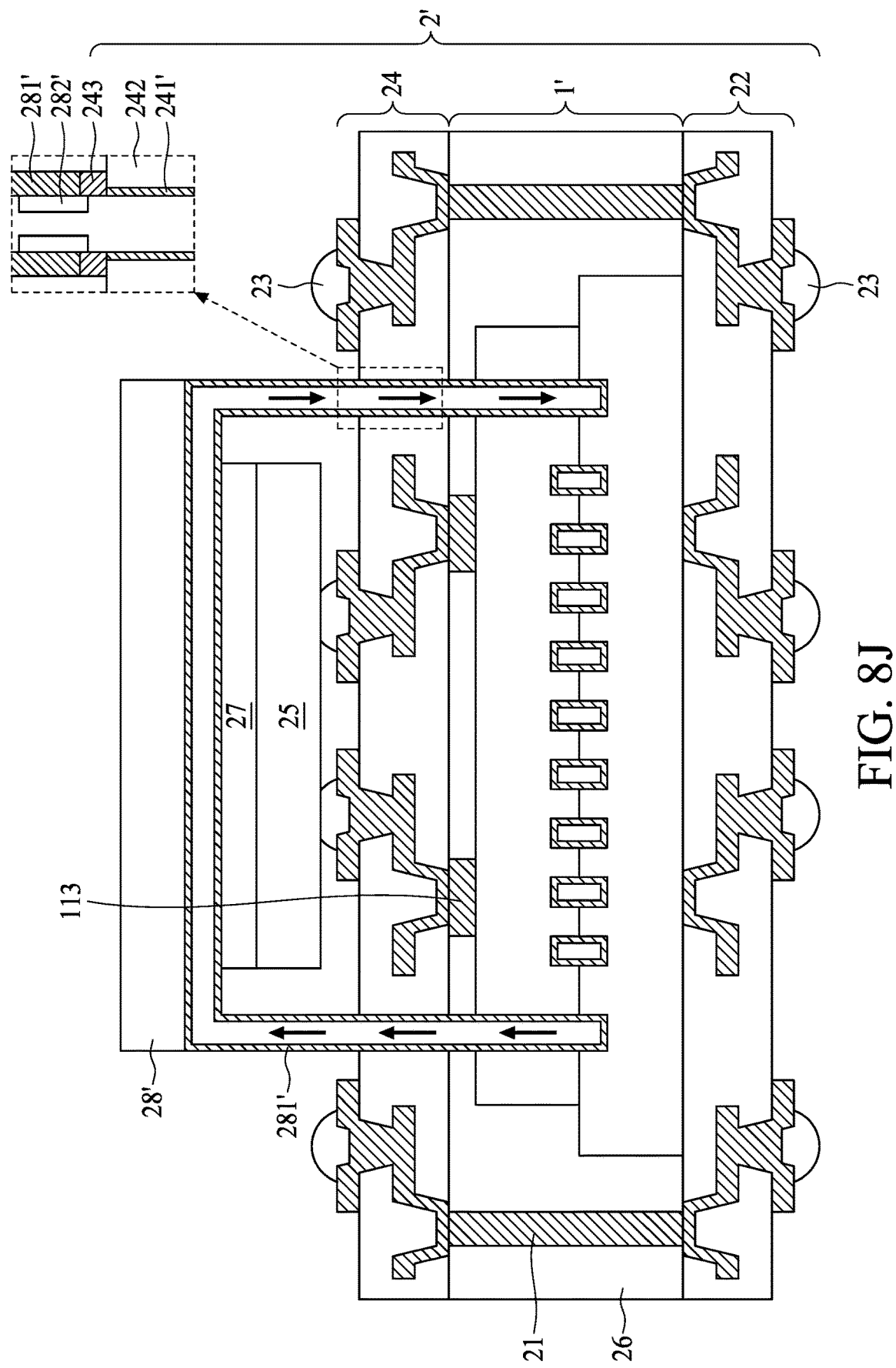

Referring to FIG. 8J, a semiconductor device 25 is disposed on the RDL 24 and electrically connected to the RDL 24 via the electrical connection elements 23. A hollow heat connection element 281' is disposed on the RDL 24 and connected to the hollow heat connection element 241'. The hollow heat connection element 281' may be made of metal or alloy or any suitable heat conductive material and may have any suitable shape. The hollow heat connection element 281' may be in directly contact with the conductive element 243 (e.g., in contact with a top surface of the conductive element 243 or a lateral surface of the conductive element 243). A fiber 282' is formed in an inner surface of the hollow heat connection element 281'.

A heat dissipation device 28' is disposed over the RDL 24. In some embodiments, the heat dissipation device 28' is disposed on the hollow heat connection element 281'. The hollow heat connection element 281' is aligned with the hollow heat connection element 241' and may be electrically connected to the hollow heat connection element 241'. A heat dissipation paste 27 may be disposed on a top surface (e.g., the back surface) of the semiconductor device 25. The heat dissipation paste 27 may be disposed between the semiconductor device 25 and the heat dissipation device 28. Accordingly, the semiconductor package structure 2 is formed.

As used herein, spatial descriptions, such as "above," "below," "up," "left," "right," "down," "front," "back," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor heat dissipation structure, comprising:
   a first semiconductor device including a first active surface and a first back surface opposite to the first active surface;
   a second semiconductor device including a second active surface and a second back surface opposite to the second active surface;
   a first heat conductive layer embedded in the first back surface of the first semiconductor device;
   a second heat conductive layer embedded in the second back surface of the second semiconductor device; and
   a third heat conductive layer disposed adjoining the first heat conductive layer and extending to the first active surface of the first semiconductor device,
   wherein the first back surface of the first semiconductor device and the second back surface of the second semiconductor device are in contact with each other and wherein at least a portion of the first heat conductive layer is in contact with the second heat conductive layer.

2. The semiconductor heat dissipation structure of claim 1, wherein the third heat conductive layer penetrates the first semiconductor device.

3. The semiconductor heat dissipation structure of claim 1, wherein the third heat conductive layer is connected to a heat dissipation device outside the semiconductor heat dissipation structure.

4. The semiconductor heat dissipation structure of claim 1, wherein the first back surface of the first semiconductor device comprises a first groove, the second back surface of the second semiconductor device comprises a second groove, the first heat conductive layer is formed in the first groove and the second heat conductive layer is formed in the second groove.

5. The semiconductor heat dissipation structure of claim 4, wherein the first groove is filled by the first heat conductive layer, and the second groove is filled by the second heat conductive layer.

6. The semiconductor heat dissipation structure of claim 4, wherein the first heat conductive layer, together with the second heat conductive layer, forms a hollow heat conductive pipe.

7. The semiconductor heat dissipation structure of claim 1, wherein the first heat conductive layer, the second heat conductive layer, or both have a serpentine shape.

8. The semiconductor heat dissipation structure of claim 1, wherein the first heat conductive layer and the third heat conductive layer are formed in one piece.

9. The semiconductor heat dissipation structure of claim 1, wherein the third heat conductive layer is disposed outside the first semiconductor device and adjacent to a lateral surface of the second semiconductor device.

10. The semiconductor heat dissipation structure of claim 1, wherein the third heat conductive layer is a hollow heat conductive pipe.

11. A semiconductor package structure, comprising:
    a semiconductor heat dissipation structure of claim 1;
    a first redistribution layer (RDL) disposed over the first active surface of the first semiconductor device and comprising a heat connection element penetrating through the first RDL; and
    a heat dissipation device disposed over the first RDL,
    wherein the third heat conductive layer of the semiconductor heat dissipation structure is connected to the heat dissipation device via the heat connection element of the first RDL.

12. The semiconductor package structure of claim 11, wherein the first semiconductor device comprises a conductive pillar, and the conductive pillar electrically connects the first semiconductor device to the first RDL.

13. The semiconductor package structure of claim 11, further comprising a third semiconductor device disposed over the first RDL.

14. The semiconductor package structure of claim 13, wherein third semiconductor device is disposed under the heat dissipation device.

15. The semiconductor package structure of claim 11, further comprising a second redistribution layer (RDL) disposed under the semiconductor heat dissipation structure.

16. The semiconductor package structure of claim 15, further comprising an encapsulant encapsulating the semiconductor heat dissipation structure.

17. The semiconductor package structure of claim 16, further comprising an interconnection element penetrating through the encapsulant and electrically connected to the first RDL and the second RDL.

18. A method of manufacturing a semiconductor package structure, comprising:
    providing a first semiconductor device including a first active surface and a first back surface opposite to the first active surface;
    providing a second semiconductor device including a second active surface and a second back surface opposite to the second active surface;
    forming a first heat conductive layer embedded in the first back surface of the first semiconductor device;
    forming a third heat conductive layer adjoining the first heat conductive layer and extending to the first active surface of the first semiconductor device;
    forming a second heat conductive layer embedded in the second back surface of the second semiconductor device;
    aligning the first heat conductive layer to the second heat conductive layer; bonding the first back surface of the first semiconductor device to the second back surface of the second semiconductor device to form a semiconductor heat dissipation structure;

encapsulating the semiconductor heat dissipation structure; and connecting a heat dissipation device to the third heat conductive layer.

19. The method of claim 18, wherein the heat dissipation device is disposed over the semiconductor heat dissipation structure.

20. The method of claim 18, wherein the first heat conductive layer and the third heat conductive layer are formed by:

forming a groove on the first back surface of the first semiconductor device;

forming a via hole within the first semiconductor device wherein the via hole connects to the groove; and applying a metal layer to the groove and the via hole to from the first heat conductive layer and the third heat conductive layer.

* * * * *